US005502675A

United States Patent [19]
Kohno et al.

[11] Patent Number: 5,502,675
[45] Date of Patent: Mar. 26, 1996

[54] SEMICONDUCTOR MEMORY DEVICE HAVING A MULTI-BIT INPUT/OUTPUT CONFIGURATION WHICH IS CAPABLE OF CORRECTING A BIT FAILURE

[75] Inventors: Tohru Kohno, Chiba; Masao Nakano, Kawasaki, both of Japan

[73] Assignee: Fujitsu Limited, Kanagawa, Japan

[21] Appl. No.: 254,412

[22] Filed: Jun. 4, 1994

Related U.S. Application Data

[63] Continuation of Ser. No. 997,142, Dec. 8, 1992, abandoned, which is a continuation of Ser. No. 533,640, Jun. 5, 1990, abandoned.

[30] Foreign Application Priority Data

Jun. 6, 1989 [JP] Japan ..................... 1-143413

[51] Int. Cl.⁶ .................. G11C 7/00; G06F 11/00
[52] U.S. Cl. ............. 365/200; 365/189.02; 365/230.03; 371/40.1
[58] Field of Search .............. 365/189.02, 189.05, 365/200, 230.03, 230.02, 230.08, 238.5; 371/2.2, 39.1, 40.1, 40.2; 395/400, 425, 575

[56] References Cited

U.S. PATENT DOCUMENTS

| | | | |
|---|---|---|---|
| 4,006,467 | 2/1977 | Bowman | 371/2.2 |
| 4,483,001 | 11/1984 | Ryan | 371/2.2 |
| 4,675,845 | 6/1987 | Itoh et al. | 365/230.03 |
| 4,691,298 | 9/1987 | Fukuda et al. | 365/230.03 |
| 4,692,923 | 9/1987 | Poeppelman | 371/2.2 |
| 4,747,080 | 5/1988 | Yamada | 365/200 |
| 4,758,995 | 7/1988 | Sato | 365/189.05 |
| 4,766,573 | 8/1988 | Takemae | 365/200 |
| 4,802,132 | 1/1989 | Ohsawa | 365/189.05 |
| 4,817,052 | 3/1989 | Shinoda et al. | 365/200 |
| 4,847,810 | 6/1989 | Tagami | 365/200 |
| 4,918,662 | 4/1990 | Kondo | 365/200 |
| 4,941,129 | 7/1990 | Oshima | 365/230.03 |
| 4,943,967 | 7/1990 | Shinodu et al. | 371/2.2 |
| 4,974,203 | 11/1990 | Sakurai | 365/189.05 |

FOREIGN PATENT DOCUMENTS 62-47900  3/1987  Japan .

OTHER PUBLICATIONS

Patent Abstracts of Japan, vol. 11, No. 236 (P–601), Japanese Patent Publication 62–047900, Mar. 2, 1987, Yoichi Hamada, "Memory Device".

IEEE Journal of Solid–State Circuits, vol. 23, No. 1, Feb. 1988, New York, pp. 20–26, Toshio Yamada et al, "A 4–Mbit DRAM With 16–Bit Concurrent ECC".

Electronic Design, vol. 33, No. 4, Feb. 1985, Hasbrouck Heights, New Jersey, pp. 121–126, 128, 130, 132, 134, and 136, Dave Bursky, "Technology Report: Digital Circuits".

*Primary Examiner*—Jack A. Lane
*Attorney, Agent, or Firm*—Nikaido, Marmelstein, Murray & Oram

[57] ABSTRACT

A semiconductor memory device includes a plurality of memory cell arrays and a plurality of word lines and bit lines. The semiconductor memory device has a plurality of row driving circuits for simultaneously activating a plurality of word lines, and a plurality of column driving circuits for simultaneously and independently activating a plurality of column selection lines to simultaneously select a plurality of bit lines. A data selector selects, from the memory cells selected by the word and bit lines, a memory cell selected by different word lines and bit lines. Thus, a plurality of bits are read out or written into the memory cell arrays in parallel.

28 Claims, 20 Drawing Sheets

Fig.4
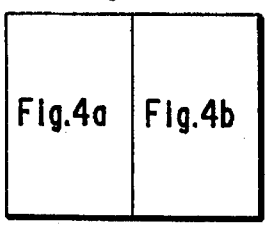
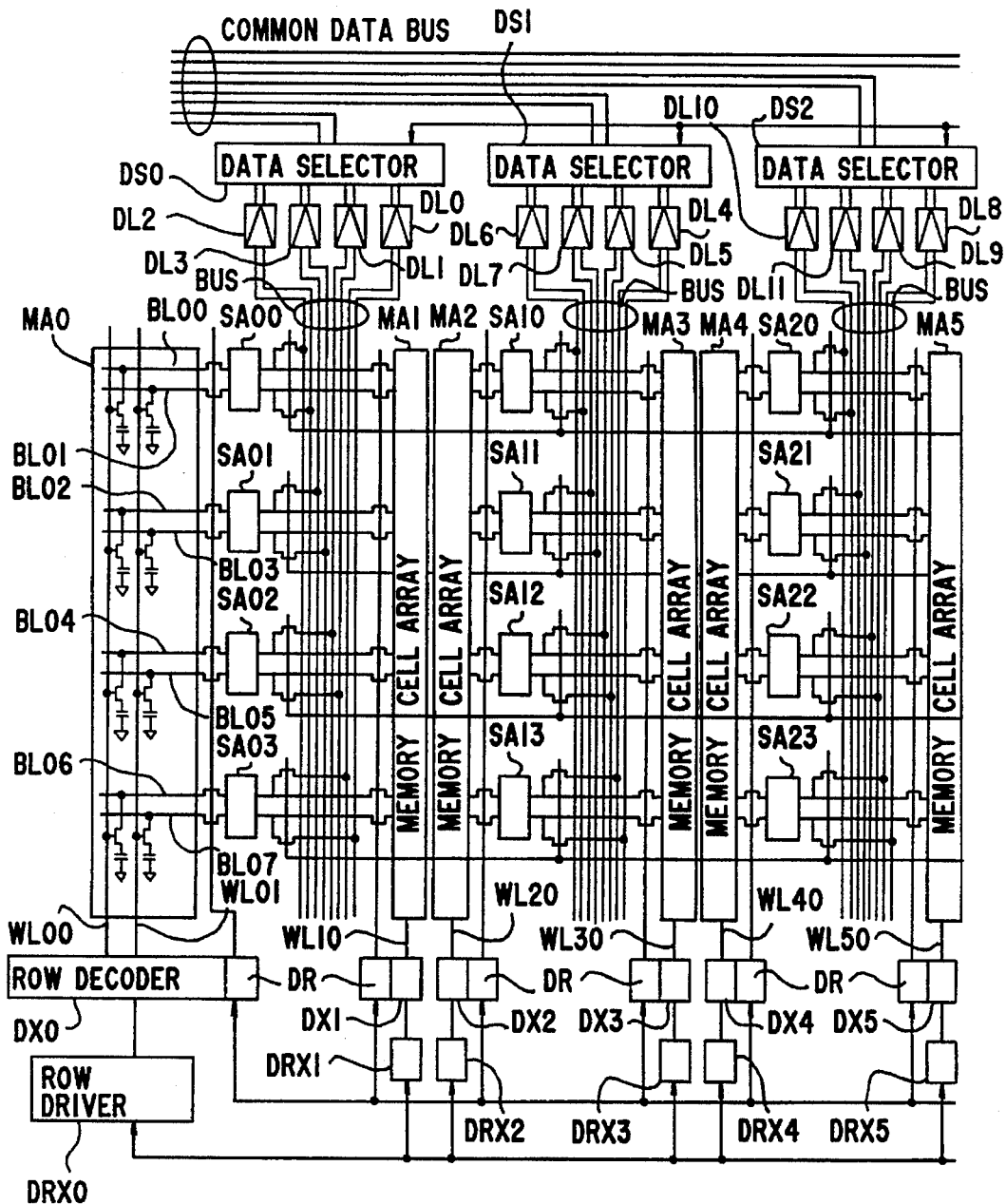
Fig.4a

| DATA LATCH | DL0 | DL4 | DL8 | DL12 |
|---|---|---|---|---|
| | DL1 | DL5 | DL9 | DL13 |
| | DL2 | DL6 | DL10 | DL14 |
| | DL3 | DL7 | DL11 | DL15 |
Fig.5A
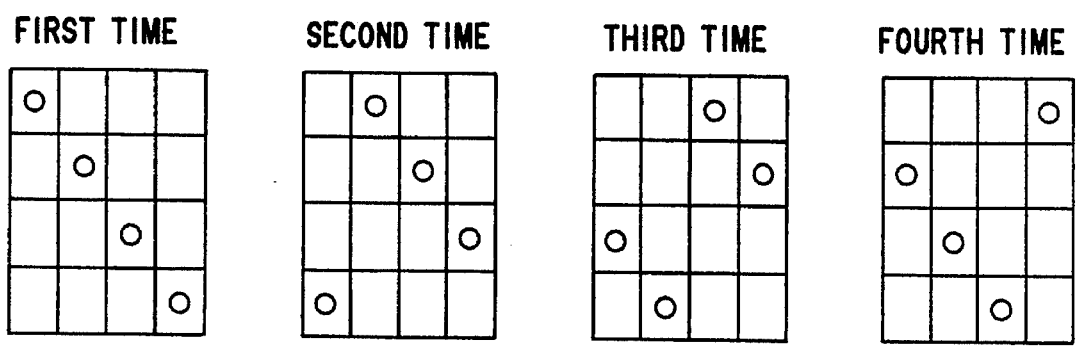
Fig.5B
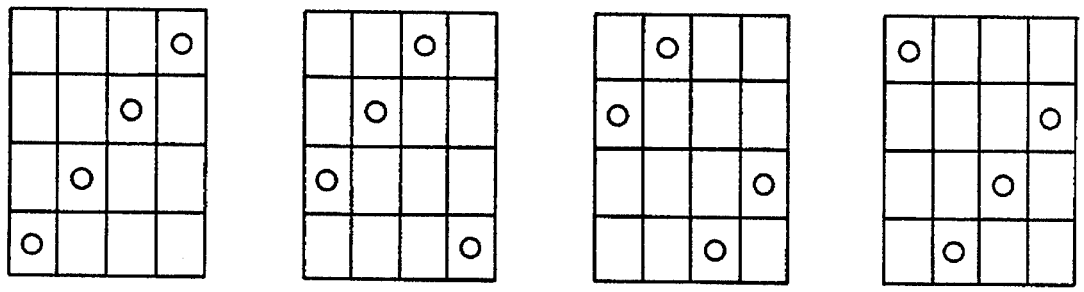
Fig.5C
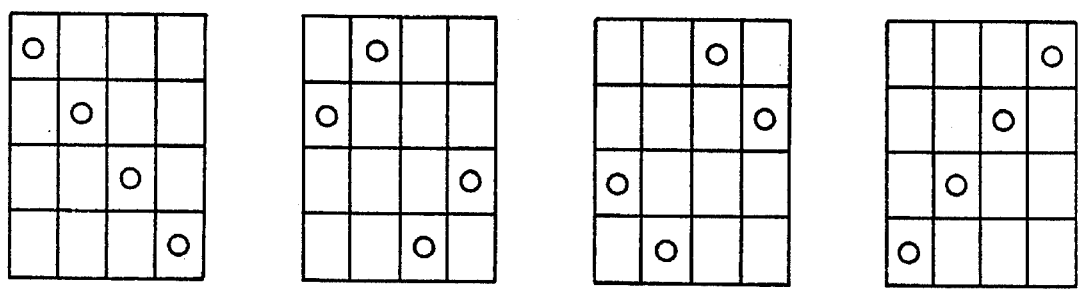
Fig.5D

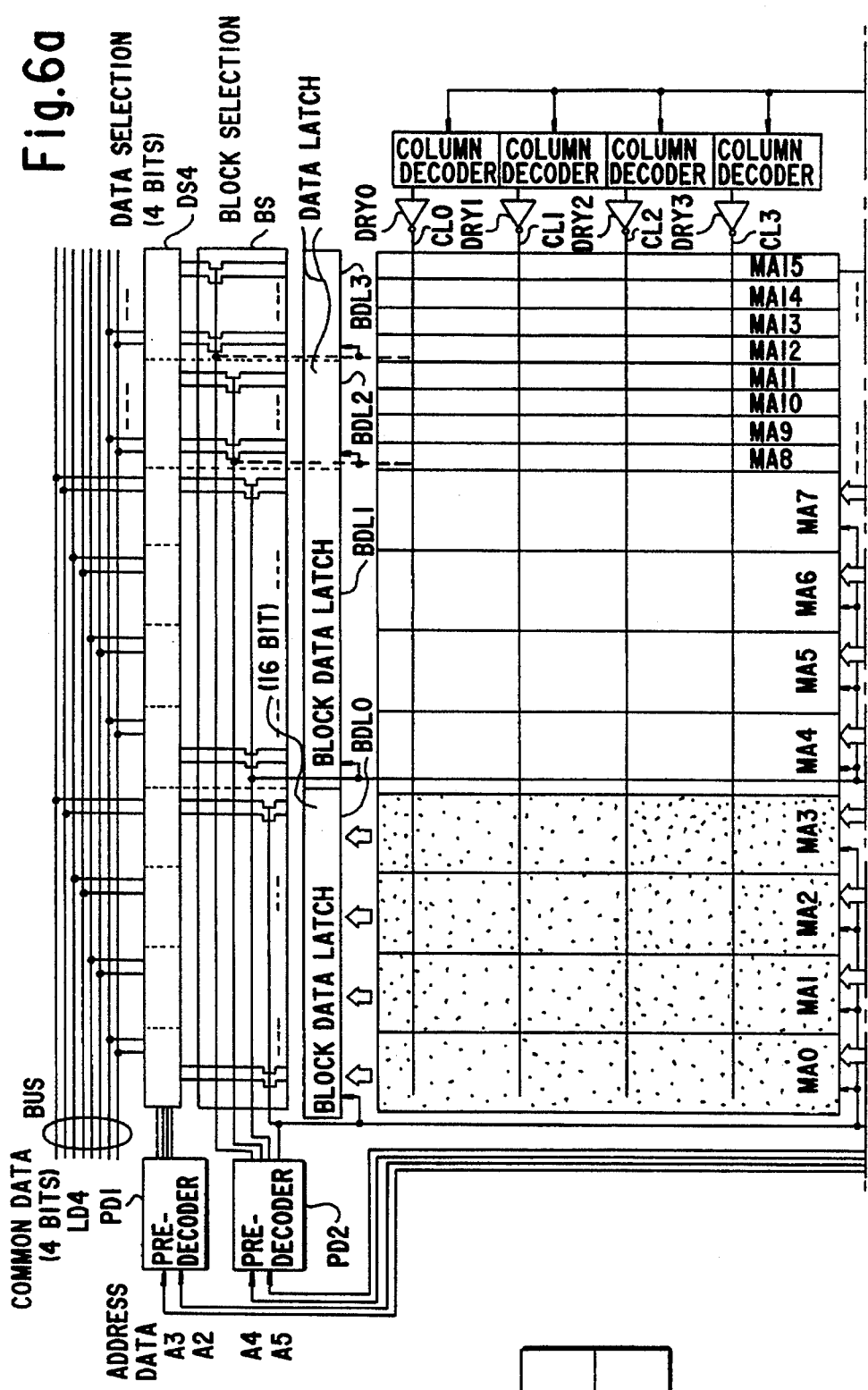

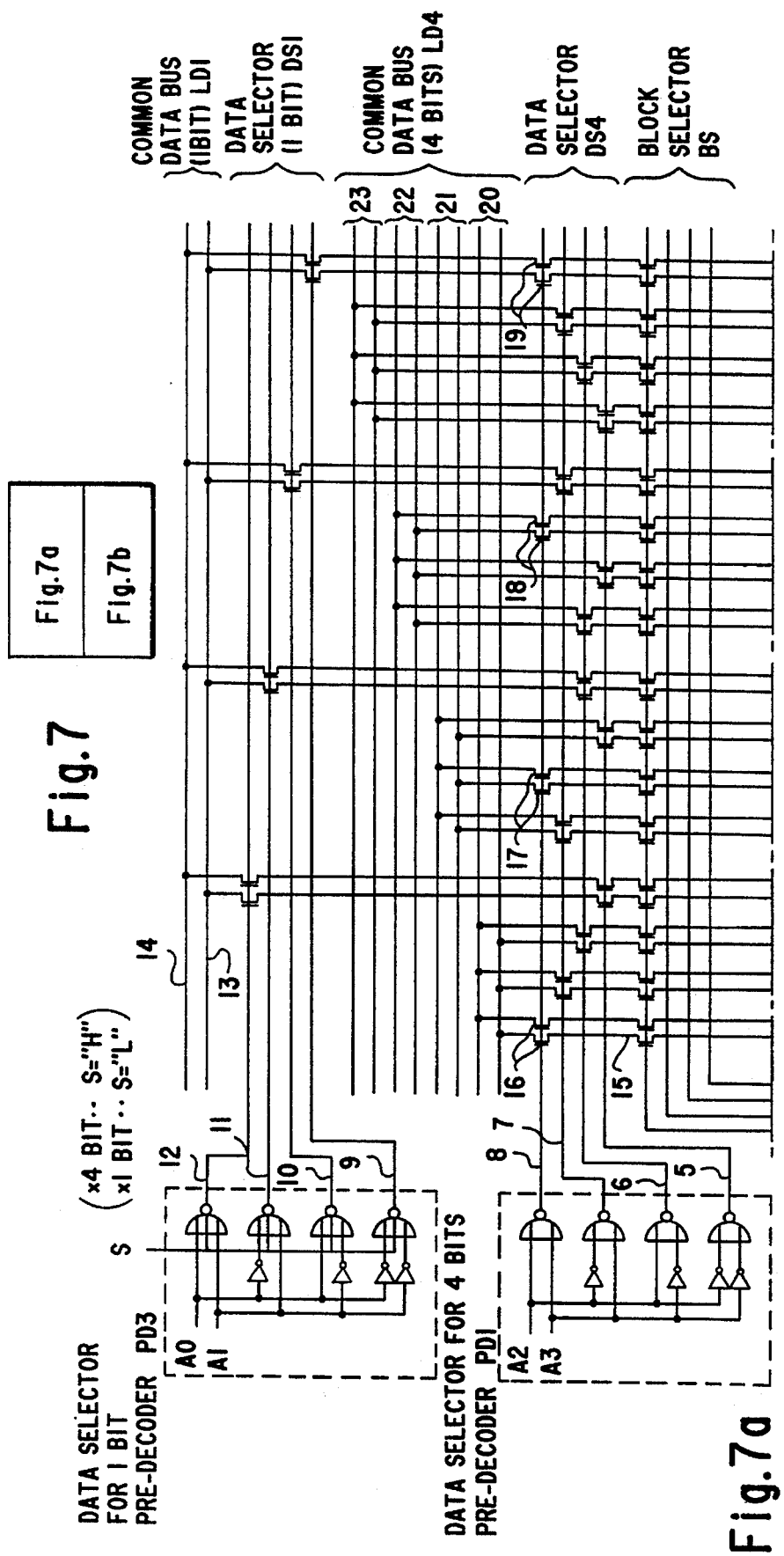

DATA LATCH

| DL0<br><br>A3 A2 A1 A0<br>0 0 0 0 | DL4<br><br>A3 A2 A1 A0<br>0 1 0 1 | DL8<br><br>A3 A2 A1 A0<br>1 0 1 0 | DL12<br><br>A3 A2 A1 A0<br>1 1 1 1 |
|---|---|---|---|
| DL1<br><br>A3 A2 A1 A0<br>0 1 0 0 | DL5<br><br>A3 A2 A1 A0<br>0 0 0 1 | DL9<br><br>A3 A2 A1 A0<br>1 1 1 0 | DL13<br><br>A3 A2 A1 A0<br>1 0 1 1 |
| DL2<br><br>A3 A2 A1 A0<br>1 0 0 0 | DL6<br><br>A3 A2 A1 A0<br>1 1 0 1 | DL10<br><br>A3 A2 A1 A0<br>0 0 1 0 | DL14<br><br>A3 A2 A1 A0<br>0 1 1 1 |
| DL3<br><br>A3 A2 A1 A0<br>1 1 0 0 | DL7<br><br>A3 A2 A1 A0<br>1 0 0 1 | DL11<br><br>A3 A2 A1 A0<br>0 1 1 0 | DL15<br><br>A3 A2 A1 A0<br>0 0 1 1 |

INTERNAL ADDRESS $\begin{pmatrix} A3, A2 & \cdots\cdots\cdots & \text{x ON CONSTRUCTING 4 BITS} \\ A3, A2, A1, A0 & \cdots\cdots & \text{x ON CONSTRUCTING 1 BIT} \end{pmatrix}$

Fig.8

VERTICAL SCANNING OF DATA LATCH

| EXTERNAL ADDRESS A3 A2 A1 A0 | INTERNAL ADDRESS A3 A2 A1 A0 | SELECTION DATA LATCH NO. |
|---|---|---|
| 0 0 0 0 | 0 0 0 0 | 0 |
| 0 0 0 1 | 0 1 0 0 | 1 |
| 0 0 1 0 | 1 0 0 0 | 2 |
| 0 0 1 1 | 1 1 0 0 | 3 |
| 0 1 0 0 | 0 1 0 1 | 4 |
| 0 1 0 1 | 0 0 0 1 | 5 |
| 0 1 1 0 | 1 1 0 1 | 6 |
| 0 1 1 1 | 1 0 0 1 | 7 |
| 1 0 0 0 | 1 0 1 0 | 8 |
| 1 0 0 1 | 1 1 1 0 | 9 |
| 1 0 1 0 | 0 0 1 0 | 10 |
| 1 0 1 1 | 0 1 1 0 | 11 |
| 1 1 0 0 | 1 1 1 1 | 12 |
| 1 1 0 1 | 1 0 1 1 | 13 |
| 1 1 1 0 | 0 1 1 1 | 14 |
| 1 1 1 1 | 0 0 1 1 | 15 |

HORIZONTAL SCANNING OF DATA LATCH

| EXTERNAL ADDRESS A3 A2 A1 A0 | INTERNAL ADDRESS A3 A2 A1 A0 | SELECTION DATA LATCH NO. |
|---|---|---|
| 0 0 0 0 | 0 0 0 0 | 0 |
| 0 0 0 1 | 0 1 0 1 | 4 |
| 0 0 1 0 | 1 0 1 0 | 8 |
| 0 0 1 1 | 1 1 1 1 | 12 |
| 0 1 0 0 | 0 1 0 0 | 1 |
| 0 1 0 1 | 0 0 0 1 | 5 |
| 0 1 1 0 | 1 1 1 0 | 9 |
| 0 1 1 1 | 1 0 1 1 | 13 |
| 1 0 0 0 | 1 0 0 0 | 2 |
| 1 0 0 1 | 1 1 0 1 | 6 |
| 1 0 1 0 | 0 0 1 0 | 10 |
| 1 0 1 1 | 0 1 1 1 | 14 |
| 1 1 0 0 | 1 1 0 0 | 3 |
| 1 1 0 1 | 1 0 0 1 | 7 |
| 1 1 1 0 | 0 1 1 0 | 11 |
| 1 1 1 1 | 0 0 1 1 | 15 |

Fig.10
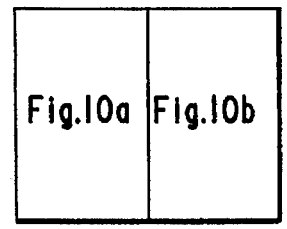
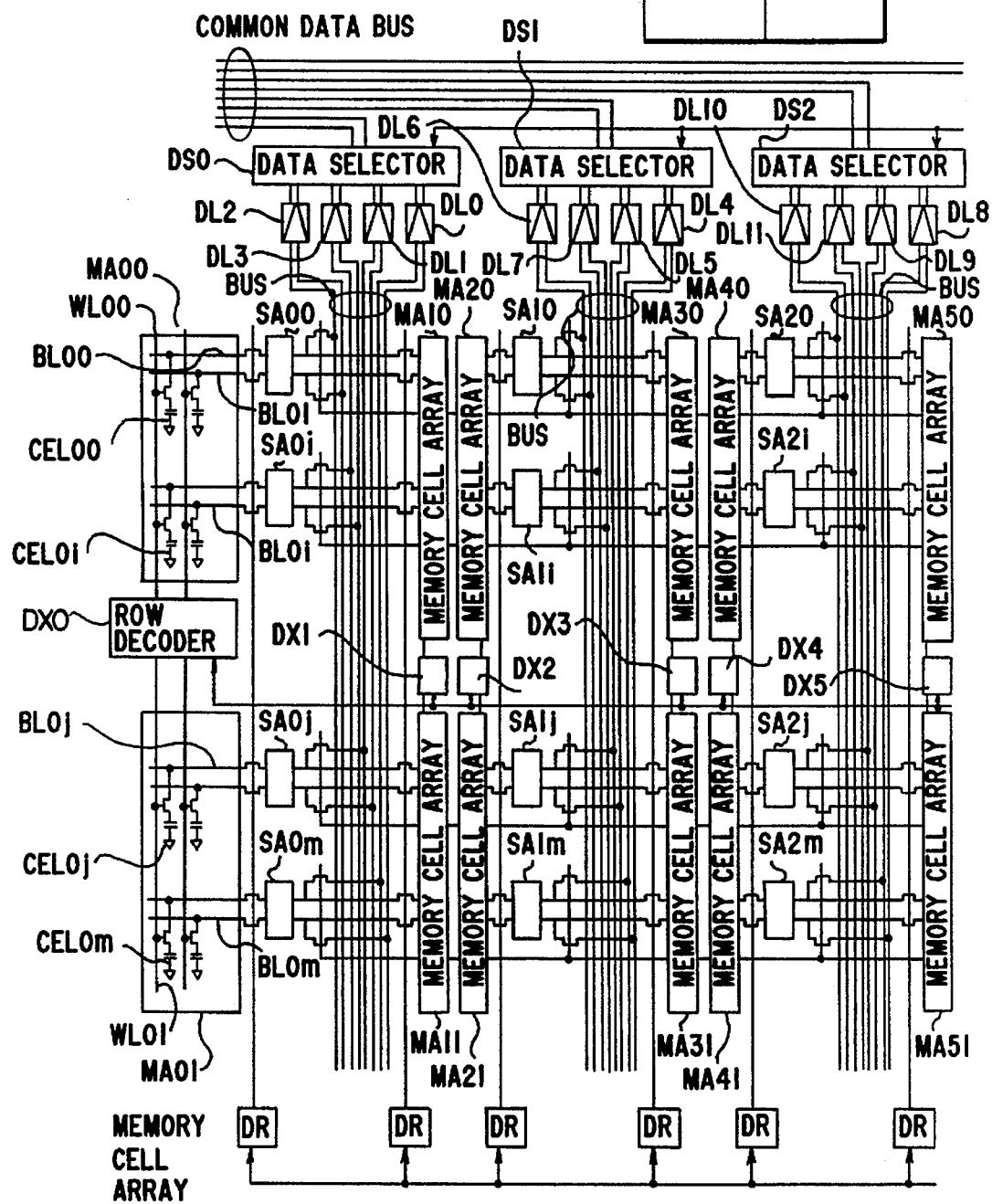
Fig.10a

SEMICONDUCTOR MEMORY DEVICE HAVING A MULTI-BIT INPUT/OUTPUT CONFIGURATION WHICH IS CAPABLE OF CORRECTING A BIT FAILURE

This application is a continuation of application Ser. No 07/997,142 filed Dec. 8, 1992, now abandoned, which is a continuation of application Ser. No. 07/533,640 filed Jun. 5, 1990, now abandoned.

BACKGROUND OF THE INVENTION

1. Field of the Invention

The present invention relates to a semiconductor memory device and, more particularly, to a selecting device for selecting memory cells in a dynamic RAM (hereinafter referred to as a DRAM) with a multi-bit input/output configuration.

With recent advances in a fine-structure manufacturing process for large-capacity semiconductor memory devices, it is desired to improve the reliability of the process and the manufactured semiconductor memory devices. To improve the reliability of the semiconductor memory devices themselves, an ECC (Error Correcting Circuit) is used in the system. In general, the Error Correcting Circuit is adapted to detect and correct one-bit error. With the errors correcting circuit used in a semiconductor memory devices with multi-bit input/output configurations, if a plurality of bits should fail, errors are not detected and corrected.

2. Description of the Related Art

FIGS. 1a and 1b illustrate a first example of a semiconductor memory device with a multi-bit input/output configuration.

This memory device includes four memory cell arrays MA0, MA1, MA2, and MA3 and a 8-bit input/output configuration. Each memory cell array, for example, memory cell array MA0, has word lines WL00 to WL0j and bit lines BL00 to BL0m wired in a matrix. A transfer transistor TT and a memory cell (CEL00 to CEL0m) are connected at each word-line/bit-line intersection. Each word line WL00 to WL0j is selected by a row decoder DX0 and driven by a row driver DRX0. An address signal supplied to respective column decoders DY0 and DY1 designates the same address and respective row decoders also designate the same address.

The bit lines are connected to corresponding sense amplifiers SA00, SA01, and so on, in pairs. The sense amplifiers sense and amplify signal variations in the memory cells CEL00 to CEL0m. Output signals of sense amplifier SA00 are read onto a data bus BUS via a transfer gate TG and two bits are latched by data latches DL0 and DL1.

Transfer gates TG0 and TG1 are turned ON or OFF by column driver DRY0 and column decoder DY0 through a column selecting line CL00. This allows bit lines BL00, BL01, BL10 and BL11 to be selected.

Other memory cell arrays MA1, MA2 and MA3 have the same configuration as cell array MA0, described above. Note that column decoder DY0 is shared between memory cell arrays MA0 and MA1 and column decoder DY1 is shared between memory cell arrays MA2 and MA3.

Next, the read operation for stored data will be briefly described.

In reading stored data, two bits are read from an array of sense amplifiers SA for each of the memory cell arrays MA0 to MA3 and data of 8 bits in total are read for application to data latches DL0 to DL7 via data bus BUS. At this point, if a column selecting line CL for any given one of sense amplifiers SA should fail, two bits of 8-bit output data will fail. Detection and correction of two bits cannot be made in the system, making use of the ECC impossible.

Recent advances in wiring techniques and manufacturing processes have given rise to metal-layer interconnected semiconductor memory devices. An example of the metal-layer interconnected semiconductor devices is illustrated in FIGS. 2a and 2b. In FIGS. 2a and 2b, like reference characters are used to designate parts corresponding to those in FIG. 1 and description thereof are omitted.

This semiconductor memory device has eight memory cell arrays arranged in one direction (in the column direction in the Figure) and column select lines CL extended on metal second layers on a substrate board (not shown) to pass across columns of sense amplifiers SA so as to share column select lines CL among the columns of sense amplifiers SA (hence memory cell arrays MA0 to MA7).

Row decoders DX0 to DX7 and row drivers DRX0 to DRX7 are provided for memory cell arrays MA0 to MA7, respectively.

DRs are drivers for driving transfer gates TG which select either of paired memory cell arrays MA0 and MA1; MA2 and MA3; . . . ; MA6 and MA7 for connection to corresponding sense amplifiers SA.

In this way, because of multilayer interconnection in which column select lines are formed of metal second layers, one column decoder DY for memory cell arrays MA0 to MA7 allows memory cells CEL to be selected and sense amplifiers SA can share column select lines CL, thus permitting high-density integration.

In reading data, one bit is read from each array of sense amplifiers SA and then latched by the corresponding data latch (DL0 to DL3) so that data of 4 bits in total are output through a data bus.

In the above semiconductor memory device, if column select lines CL belonging to any given array of sense amplifiers SA should fail, 4 bits of output data will all fail. Thus, this semiconductor memory device also cannot use the Error Correcting Circuits, as is the case with the semiconductor memory device of FIG. 1.

As in the semiconductor memory devices of FIGS. 1 and 2, in a semiconductor memory device in which a plurality of bit lines associated with a selected word line through memory cells are activated simultaneously by a common column select line in each memory cell array, if the column select line should fail, many bits will fail simultaneously. Thus, the one-bit-accommodating Error Correcting Circuit cannot be adapted to such a memory device.

SUMMARY OF THE INVENTION

It is therefore an object of the present invention to provide a semiconductor memory device of multi-bit input/output configuration in which, if a failure should occur, it will result in a one-bit failure, thus enabling an error correcting circuit to be used in the system.

A feature of the invention resides in a semiconductor memory device comprising a plurality of memory cell arrays each having memory cells connected to a plurality of word lines and bit lines comprises row selective device for simultaneously activating a plurality of word lines; column selective device for simultaneously selecting a plurality of the bit lines by simultaneously and independently activating a plurality of column selective lines and; data selector device for selecting, from memory cells selected by the row and column selective device, memory cells which are selected by a combination of different word lines and bit lines.

BRIEF DESCRIPTION OF THE DRAWINGS

FIG. 4a and 4b are a block diagram of a semiconductor memory device according to a first embodiment of the present invention;

FIGS. 5A to 5D are diagrams for explaining the readout of data according to a shifted diagonal system;

FIGS. 6a and 6b are a block diagram of a semiconductor memory device according to a second embodiment of the present invention;

FIGS. 7a and 7b illustrate a circuit arrangement of the data selector of FIG. 4;

FIG. 8 is a diagram for explaining addresses for selecting of the data latches of FIG. 4;

FIGS. 10a and 10b are a block diagram of a semiconductor memory device according to a third embodiment of the present invention;

PREFERRED EMBODIMENT OF THE PRESENT INVENTION

The embodiment of the present invention will be described by referring to the attached drawings.

A description will be given herein of a two-bit input/output bit configuration.

Figure 3:
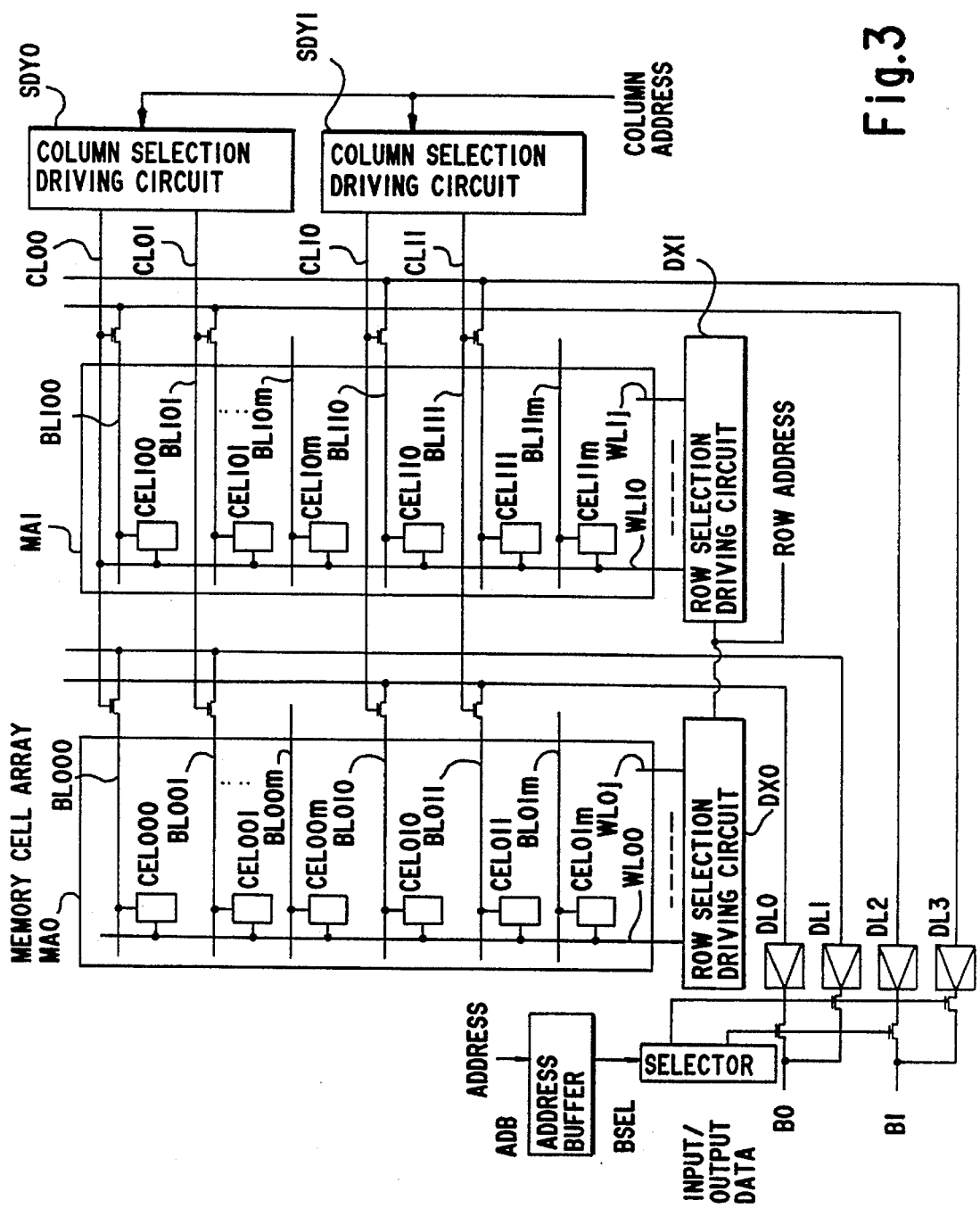
FIG. 3 is a diagram for explaining the principle of the present invention.

FIG. 3 shows a principle embodiment of the present invention.

In FIG. 3, a semiconductor memory device has a plurality of memory cell arrays (MA0 to MA1) in each of which memory cells (CEL000 to CEL00m, CEL010 to CEL01m) are placed at intersections of word lines (WL00 to WL0j) and bit lines (BL000 to BL00m, BL010 to BL01m), the present invention is provided with selective drive circuits (SDY0, SDY1) for driving plural bit lines (BL000, BL010) simultaneously among the bit lines (BL000 to BL00m, BL010 to BL01m) associated with a selected word line (WL00) via memory cells (CEL000 to CEL00m, CEL010 to CEL01m).

A case where the input/output bit configuration comprises two bits will be explained herein.

In operation, it is assumed that, in each memory cell array (MA0, MA1), word lines (WL00, WL10) are selected by row-selective drive circuits (DX0, DX1).

In memory cell array (MA0), memory cells (CE000 to CEL00m and CEL010 to CEL01m) are associated with selected word line WL00 and plural bit lines (for example, BL000, BL010) of bit lines (BL000 to BL00m, and BL010 to BL01m) associated with those memory cells are simultaneously selected by column-selective drive circuits (SDY0, SDY1) independently of each other.

Data on simultaneously selected bit lines (BL000 and BL010) are latched by data latches (DL1, DL0) respectively.

In memory cell array (MA1), plural bit lines (BL100 and BL110) of bit lines (BL100 to BL10m and BL110 to BL11m) associated with memory cells (CEL100 to CEL10m, CEL110 to CEL11m) on selected word line (WL10) are simultaneously selected by column-selective drive circuits (SDY0 and SDY1) and independently of each other. Data on selected bit lines (BL100 and BL110) are latched by data latches DL2 and DL3, respectively.

After being latched by the data latches, one bit is selected from 2 bits read from each memory cell array because the input/output bits are 2 bits, one bit is selected from (DL0, DL1) and one bit is also selected from (DL2, DL3), so that a total of 2 bits (B0, B1) are output. For example, if column selective line CL00 fails, no data will be read into latches DL1 and DL2. However, no data is read simultaneously from latches DL1 and DL2 because of the selecting operation of a selector BSEL, and data will be read from either of latches DL1 and DL2. This will result in a 1-bit error. Thus, even if one word-line/bit-line fails, only one bit fails in input/output data (B0, B1). Therefore, a 1-bit Error Correcting Circuit can be used in an external system.

The 2-bit configuration has been described herein. The same is true of other plural bit configurations.

First Embodiment

Figure 2:
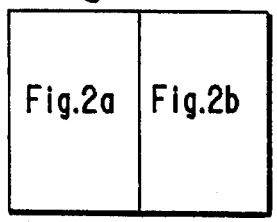
FIGS. 2a and 2b are a block diagram of a second semiconductor memory device.
Figure 2A:
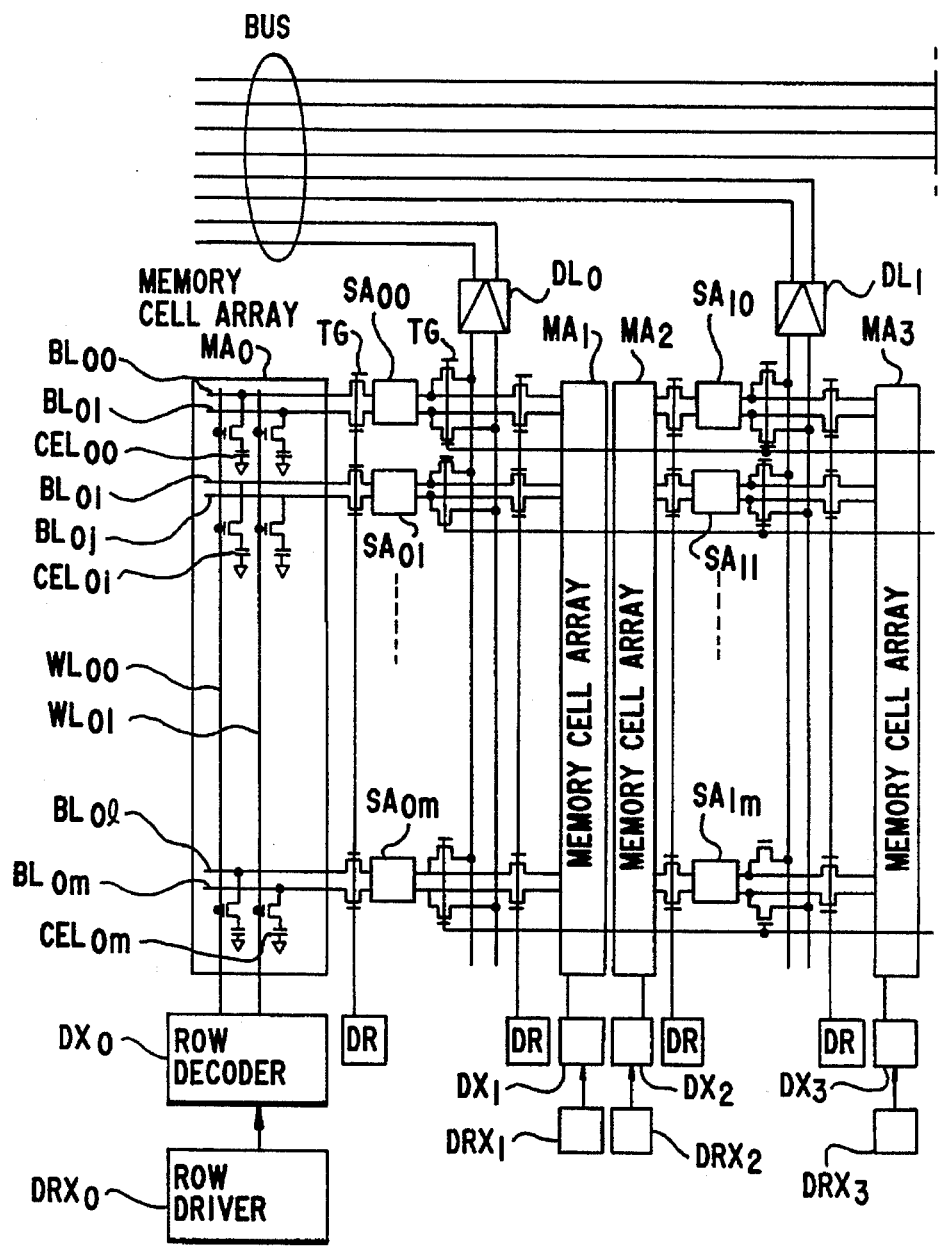
Figure 2B:
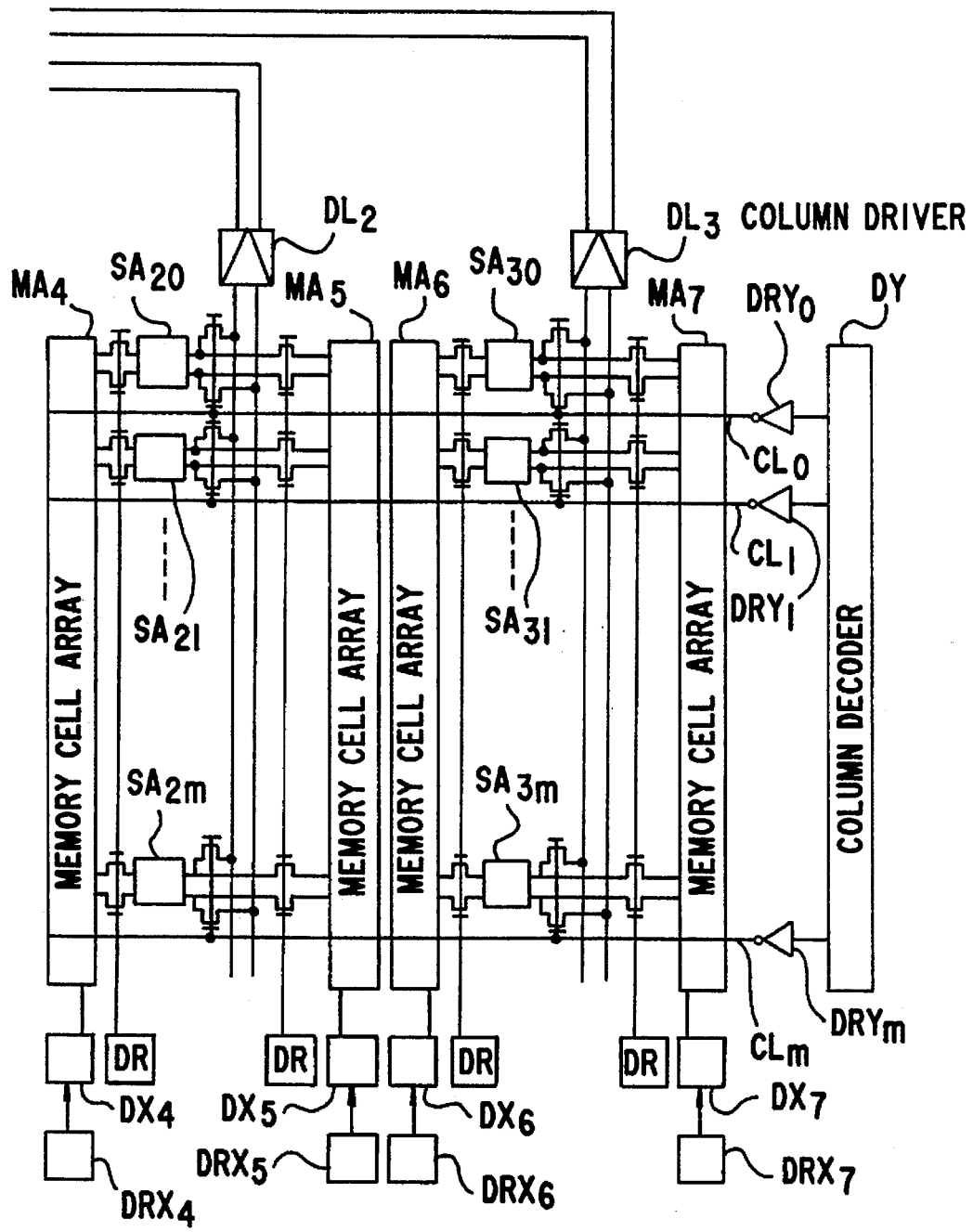
Figure 4B:
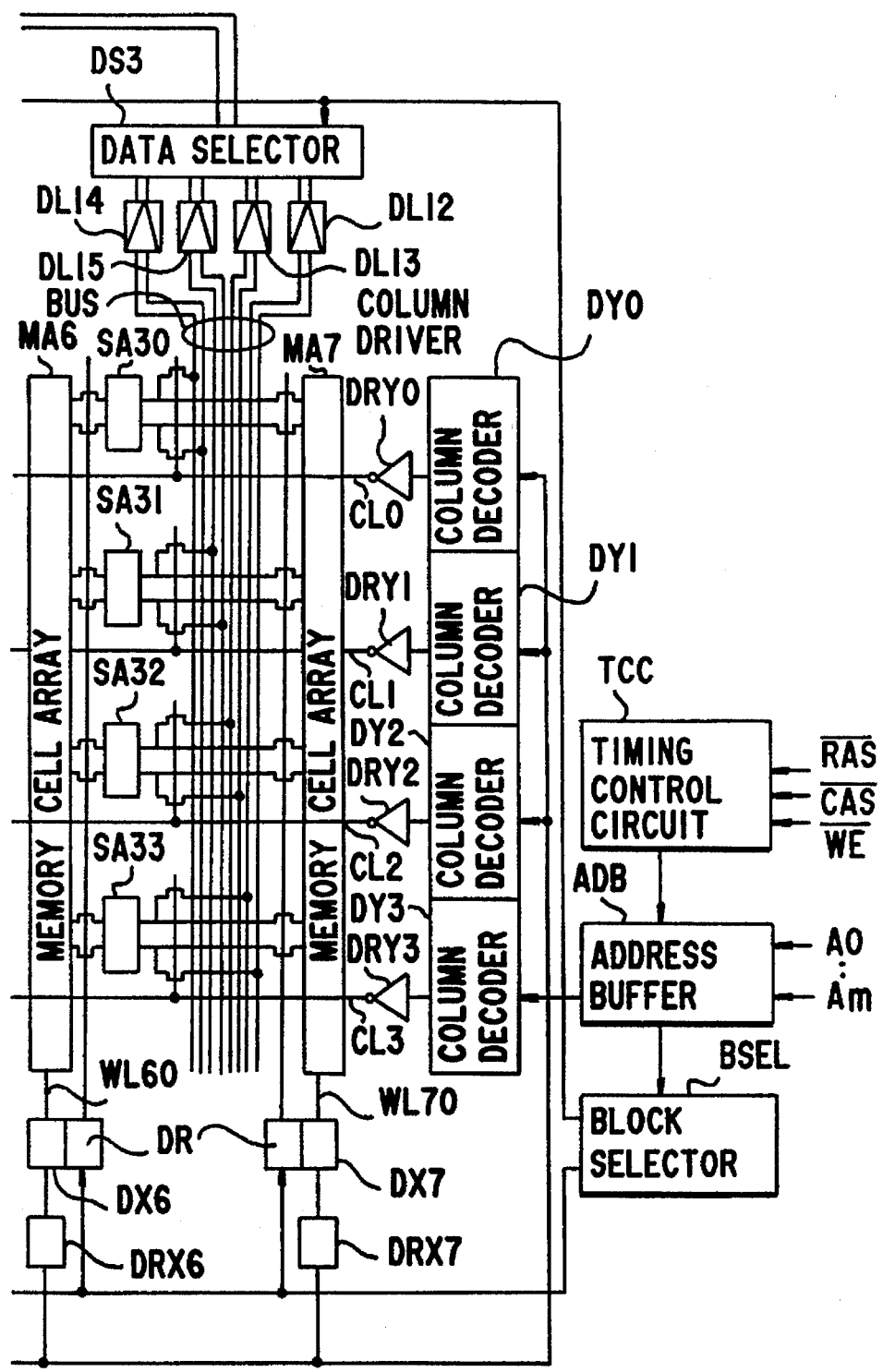

FIGS. 4a and 4b illustrate a first embodiment of the present invention which corresponds to the semiconductor memory device of FIG. 2. The semiconductor memory device shares column select lines CL among arrays of sense amplifiers SA of memory cell arrays MA0 to MA7 by the use of a second-layer wiring. The first embodiment is the same as the semiconductor memory device of FIG. 2 in this respect.

Figure 1:
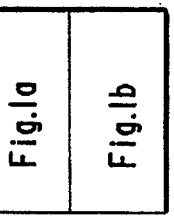
FIGS. 1a and 1b are a block diagram of a first prior semiconductor memory device.
Figure 1A:
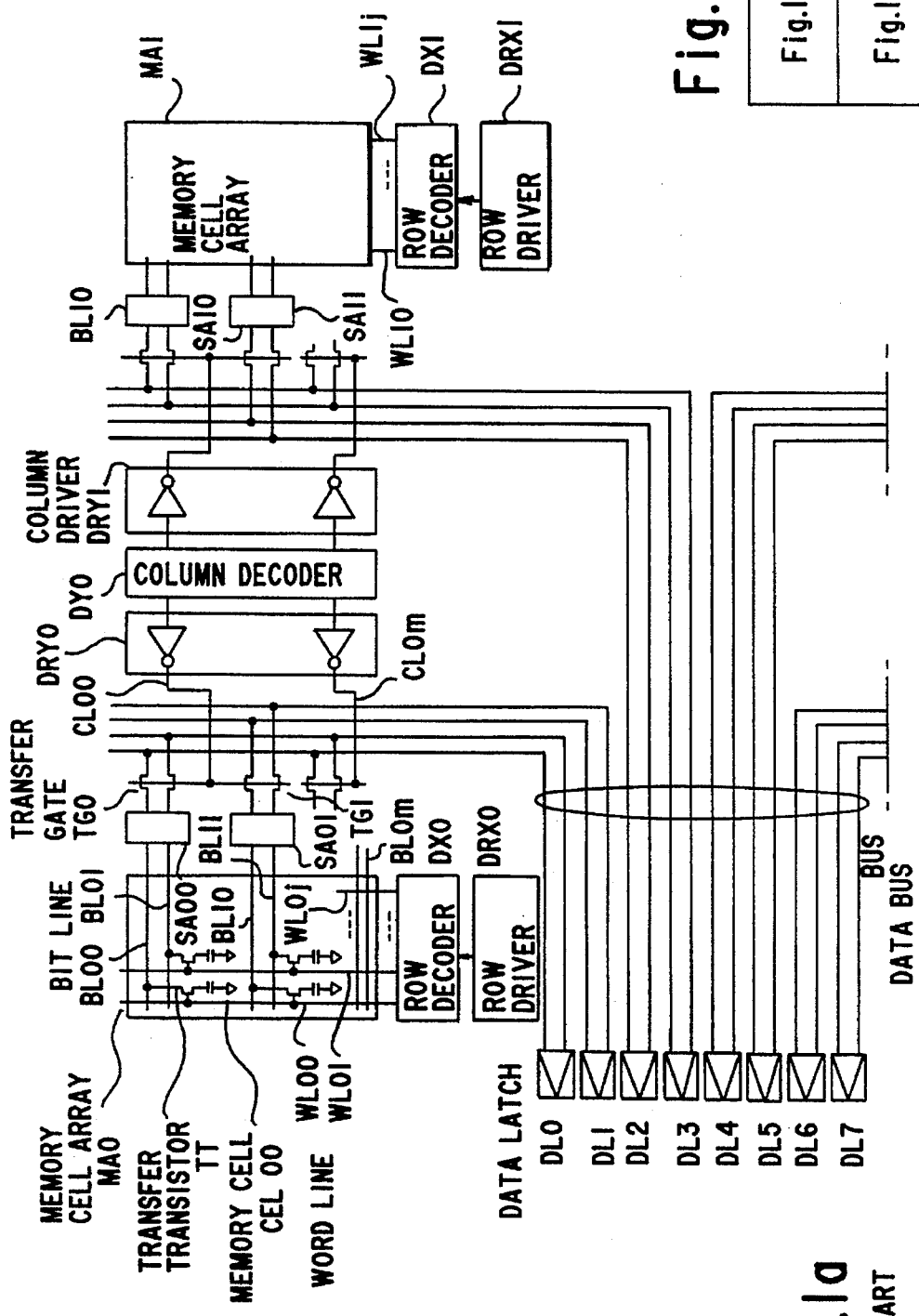
Figure 1B:
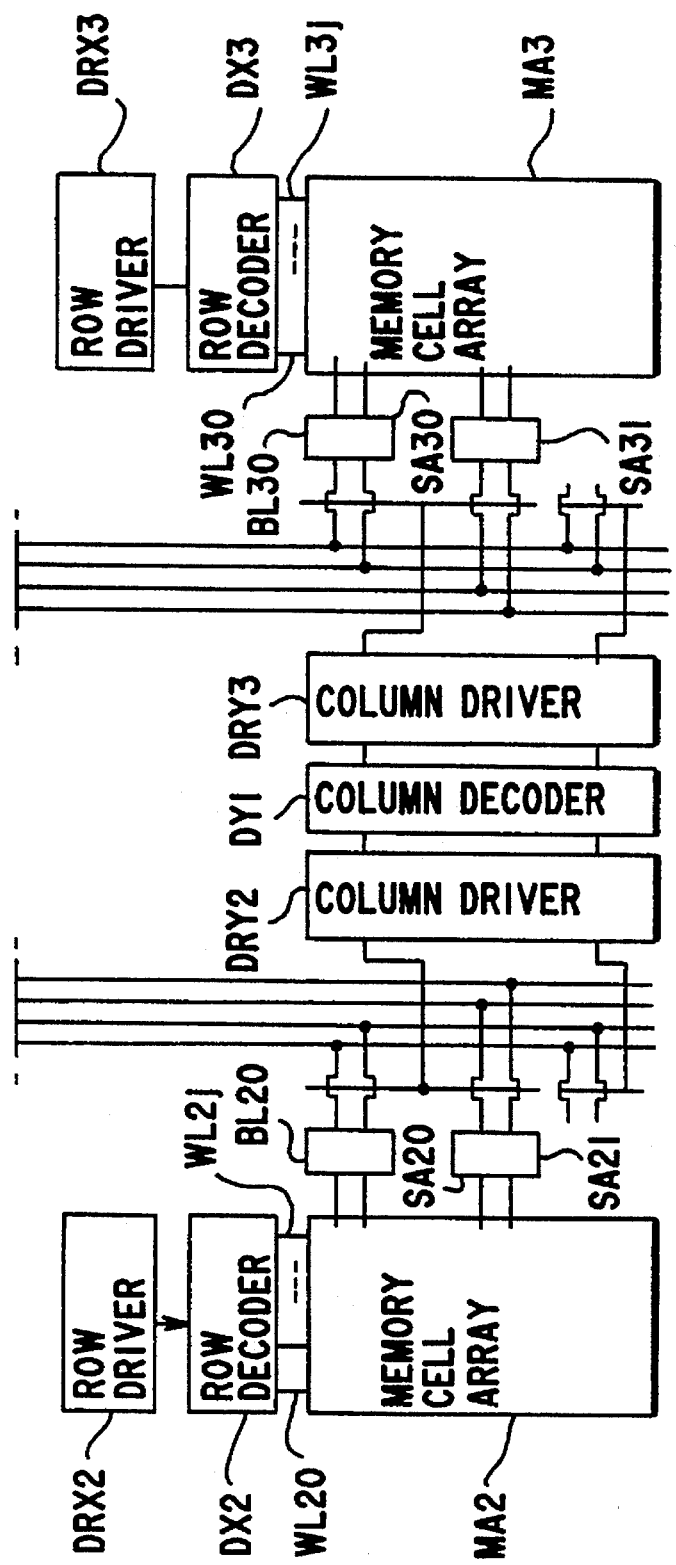

The first embodiment is essentially distinct from the semiconductor memory device in that independent column decoders DY0 to DY3 are used, independent row selective drive circuits DX0 to DX7 are connected to memory cell arrays MA0 to MA7, respectively, row selective drive circuits DX0 to DX7 are selectively switched by block selector BSEL and column decoders DY0 to DY3 and row selective drive circuits DX0 to DX7 are subjected to address control by address signals from address buffer ADB. Address buffer ADB is controlled by timing control circuit TCC which is supplied with a row address strobe signal $\overline{RAS}$, a column address strobe signal $\overline{CAS}$ and a read/write enable signal $\overline{WE}$. As illustrated by MA0, the internal arrangement of memory cell arrays MA0 to MA7 has a memory cell disposed at each word-line/bit-line intersection arrayed in a matrix and it is the same as those of FIGS. 1 and 2.

Arrays of sense amplifiers SA00 to SA0m, SA10 to SA1m, SA20 to SA2m and SA30 to SA3m have their respective individual row decoders DX0 to DX7 and row drivers DRX0 to DRX7. The number of word lines which are selected simultaneously is equal to or greater than the number of bits in input/output multi-bit configuration (for example, 16 bits in the case of 4-bit input/output configuration). Since the 4-bit configuration is considered herein, four word lines are selected simultaneously. For example, WL00, WL20, WL40 and WL60 are selected simultaneously.

The arrays of sense amplifiers have common column select lines CL0 to CLm. The number of column select lines which are selected simultaneously is equal to or greater than the number of bits in input/output multi-bit configuration. Because of the 4-bit configuration, four column select lines, for example, CL0, CL1, CL2 and CL3, are selected simultaneously.

Therefore, a total of 16 bits of data in 4 rows and 4 columns is latched by data latches DL0 to DL15, each adapted to latch one bit at a time.

A memory-cell selecting device of the present semiconductor memory device is adapted to finally output 4 bits and thus has to take out 4-bit data from 16-bit data. In this case, to permit an Error Correcting Circuit to be used when one word line or column select line fails, data has to be taken out in such a way that, of four output bits, only one bit fails. To this end, 4-bit data has only to be taken out four times by different word lines and different column-select lines. This is performed by data selector DS0 connected to data latches DL2, DL3, DL1 and DL0, data selector DS1 connected to data latches DL6, DL7, DL5 and DL4, data selector DS2 connected to data latches DL10, DL11, DL9 and DL8 and data selector DS3 connected to data latches DL14, DL15, DL13 and DL12. 4 bits are selected from 16 bits by data selectors DS0, DS1, DS2 and DS3 at one cycle and are output from a common data bus.

As such a method of taking out data, from data selector DS0, DS1, DS2 and DS3, there is a shifted diagonal system. FIGS. 5A to 5D illustrate three examples of data access according to the shifted diagonal system. FIGS. 5B, 5C and 5D illustrate first, second and third examples of methods of reading data from 16 data latches DL0 to DL15 of FIG. 5A, four times four bits at a time. The first and second examples B and C are essentially the same except that they are opposite to each other in the direction of shift. The example of FIG. 5D can be said to be a modified shifted diagonal system in that bits are reversed two bits by two bits in the second and third data readout.

For example, in FIG. 5A, data in the first row in DL0, DL4, DL8 and DL12 are the contents which will be read simultaneously by activating column selective line CL3. In the event of a failure of column selective line CL3, all bits latched as the first row data will be in error. For this reason, the shifted diagonal systems illustrated in FIGS. 5B, 5C and 5D allow, when four sets of four bits are read from 16 bits separately, only one bit of failed bits in DL0, DL4, DL8 and DL12 to be read and prevent more than one bit from being read in each cycle of data readout. For example, in the system of FIG. 5B, the data of the (1, 1) element is in error, but the data of the (2, 2), (3, 3) and (4, 4) elements are correct in the first period. Thus, only one of the 4-bit data results are in error. In the second period the (1, 2) element is in error and the remaining (2, 3), (3, 4) and (4, 1) elements are correct. In the third period the (1, 3) element is in error and the remaining (2, 4), (3, 1) and (4, 2) elements are correct. Finally, in the fourth period the (1, 4) element is in error and the remaining (2, 1), (3, 2) and (4, 3) elements are correct. In each period, therefore, 4-bit data can be read with one bit in error. The one-bit error can be corrected by an external Error Correcting Circuit. Thus, information will be obtained which is correct in four bits. Therefore, even if the four bits in the first row of 16 bits in FIG. 5A are all in error, 16-bit information which is correct in all bits will be obtained from the Error Correcting Circuit as long as it operates properly in each cycle. That is, more than three of the 16 bits will be corrected. The same is true of the systems of FIG. 5C and 5D.

In summary, as shown in FIGS. 4a and 4b, plural bits are output simultaneously by selecting any given word line from memory cell array blocks MA0 and MA1, MA2 and MA3, MA4 and MA5, MA6 and MA7 and any given column select line from common column select lines, and one bit is output from each of respective memory cells so as to fit the number of input/output bits of the data selector of the present semiconductor memory device from the data. Thus, all the bits of output data will not fail and the failure is limited to only one bit even if the word lines or column select lines fail. Therefore, this Error Correcting Circuit can be used, thereby improving the reliability of a semiconductor memory device of a multi-bit input/output configuration.

Second Embodiment

Figure 6B:
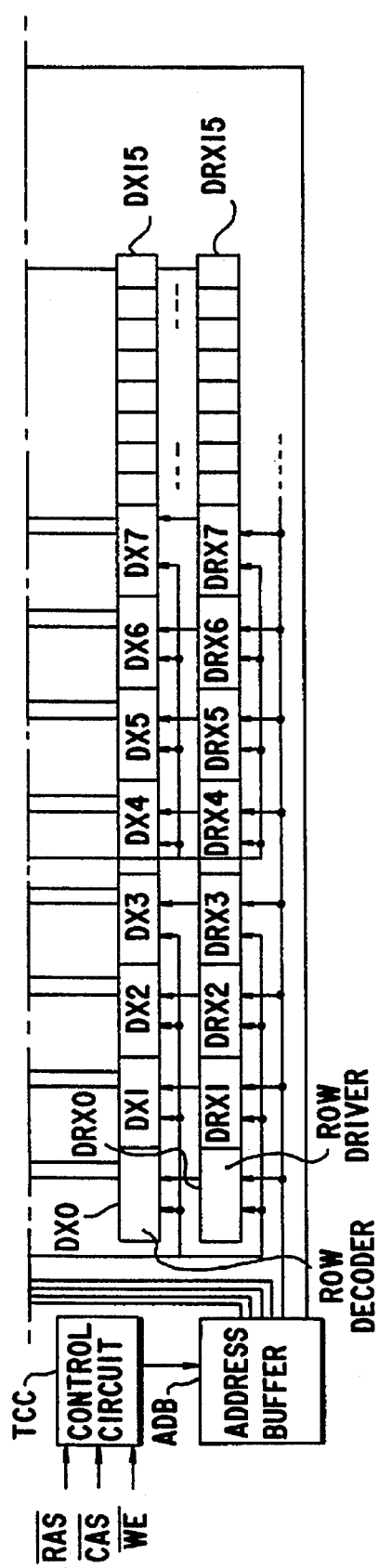

A second embodiment of the present invention is illustrated in FIGS. 6a and 6b.

This figure shows an example in which the present invention is applied to a DRAM having 16 memory cell arrays MA0 to MA15. In the Figure, sense amplifiers are excluded from the illustration as they are placed within memory cell arrays MA0 to MA15.

Associated with memory cell arrays MA0 to MA15 are their respective row decoders DX0 to DX15 and row drivers DRX0 to DRX15. 16 memory cell arrays MA0 to MA15 are divided into 4 blocks for ¼ block operation. In this block operation, a block selector BS is selected by a second pre-decoder PD2 supplied with an address input of two bits A4 and A5 and ¼ of 16 row drivers are selectively enabled by applying outputs of second pre-decoder PD2 to the row drivers (DRX0 to DRX15). Note that for ⅛ block operation the address input to second pre-decoder PD2 is only required to have three bits.

Associated with the blocks (MA0 to MA3, MA4 to MA7, MA8 to MA11 and MA12 to MA15) are their respective block data latches BDL0, BDL1, BDL2 and BDL3 for each of the 16 bits. Second pre-decoder PD2 enables only one block data latch (for example, BDL0) to allow 16-bit data read from the enabled block to be output to data selector DS4 via block selector BS. In data selector DS4, four bits are selected from 16 bits by first pre-decoder PD1 and output.

In the above configuration, a total of four word lines, one for each memory cell array enabled by second pre-decoder PD2, are driven simultaneously and four common column select lines (for example, CL0, CL1, CL2, CL3) are driven simultaneously. Then, data from memory cells at intersections of the different word lines and different column select lines, i.e., data of 16 bits in total, are output from a selected block, latched by a selected data latch circuit (for example, BDL0) and then four bits are finally output from data selector DS4.

Figure 7B:
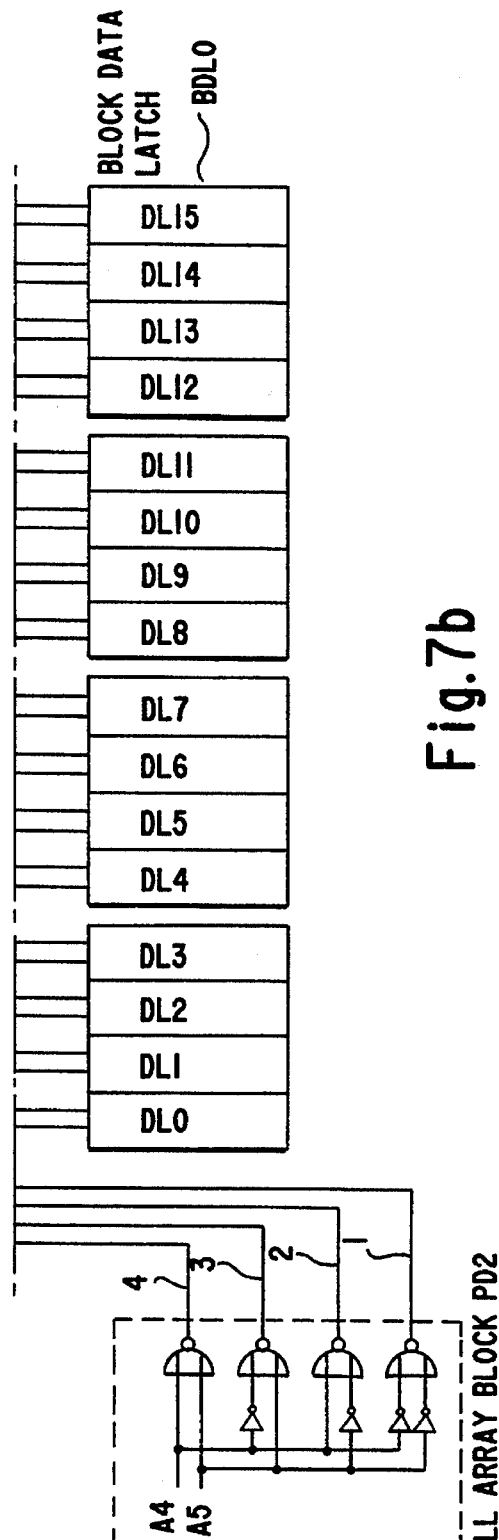

FIGS. 7a and 7b illustrate a circuit arrangement of data selector DS4. This circuit arrangement is adapted to the modified shifted diagonal system (refer to FIG. 5D. In this Figure are also illustrated exemplary circuit arrangements of data selector DS1 and pre-decoder PD which adapt the "4-bit" input/output configuration to the "1-bit" configuration by using a method such as a bonding option and AL master slice.

Pre-decoder PD3 receives a 2-bit address input of A0 and A1 and is arranged to provide the "4-bit" input/output configuration when a switching signal S is at a HIGH level and the "1-bit" input/output configuration at a LOW level of switching signal S, thereby converting 4-bit data to 1-bit data. The block data latch circuit (for example, BDL0) is comprised of 16 data latch circuits (DL0 to DL15) which are selected by address inputs A0 to A3.

In FIGS. 7a and 7b, data selector DS4 selects 4 bits from 16-bit data in block data latches DL0 to DL15 and applies them to common data bus LD4. The shifted diagonal system of FIG. 5D is used as the selection system. First, data from DL0 to DL15 belong to block data latch BDL0, not to other blocks, and the data readout of BDL0 is effectively selected by block selector BS. To make this block selection, only line 4 of pre-decoder PD2 is activated to logic 0 when address inputs A4 and A5 are both at 0 so that pass transistor 15 and all other transistors provided on the right side of transistor 15 are all turned on. The contents of latches DL0 to DL15 are thereby effectively input to data selector DS4. In data selector DS4, 4 bits are selected from 16 bits by activating only one of output lines 8, 7, 6 and 5 of pre-decoder PD1 to logic 1, according to address signals A2, A3 thereto. In pre-decoder PD1, line 8 goes to 1 when A2 and A3 are both at 0, line 7 goes to 1 when A2 and A3 are at 1 and 0, respectively. Line 6 goes to 1 when A2 and A3 are at 0 and 1, respectively, and line 5 goes to 1 when A2 and A3 are both at 1. In data selector DS4, 16 pass transistors are placed in the positions illustrated. With this placements, for example, when line 8 is at a logic 1, pass transistors 16, 17, 18 and 19, connected to line 8, become ON state. At this point, 4 bits are read from DL0, DL4, DL10 and DL15 onto common data buses 20, 21, 22 and 23 via the source-to-drain paths of enabled pass transistors 16, 17, 18 and 19, respectively. In this case, the read four bits correspond to diagonal components DL0, DL5, DL10 and DL15 in FIG. 5A and this corresponds to the first data readout in FIG. 5D.

When line 7 is at 1, DL1, D14, DL11 and DL14 are read onto common data buses 20, 21, 22 and 23. These correspond to element (2, 1), element (1, 2), element(4, 3) and element (3, 4) in FIG. 5A and this corresponds to the second readout in FIG. 5D. When line 6 is at 1, DL2, DL7, DL8 and DL13 are read onto common data buses 20, 21, 22 and 23. These correspond to element (3, 1), element (4, 2), element (1, 3) and element (2, 4) in FIG. 5A and this corresponds to the third readout in FIG. 5D. When line 5 is at 1, DL3, DL6, DL9 and DL12 are read onto common data buses 20, 21, 22 and 23. These correspond to element (4, 1), element (3, 2), element (2, 3) and element (1, 4) in FIG. 5A and this corresponds to the fourth readout in FIG. 5D.

That is, the shifted diagonal system is implemented by data selector DS4.

The system for selecting 4 bits from 16 bits has already been described. To select 1 bit from 16 bits, one of the common data buses 20, 21, 22 and 23 is connected to another common data bus LD1 by data selector DS1.

This selection is made by pre-decoder PD3 such that one of row lines 12, 11, 10 and 9 is activated by address signals A0 and A1 when control line S is at 0. More specifically, line 12 is activated when A0=0 and A1=0, line 11 is activated when A0=1 and A1=0, line 10 is activated when A0=0 and A=1, and line 9 is activated when A0=1 and A1=1.

Figure 9A:
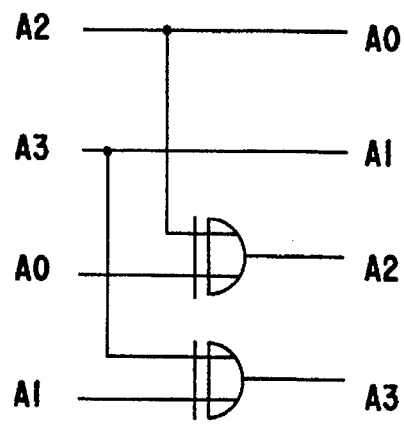
FIGS. 9A and 9B are diagrams for explaining a data latch scan.

The address signals A0 to A3 described above are internal addresses which are obtained by converting or scrambling external address signals A0 to A3 in accordance with the systems illustrated in FIGS. 9A and B.

Figure 9B:
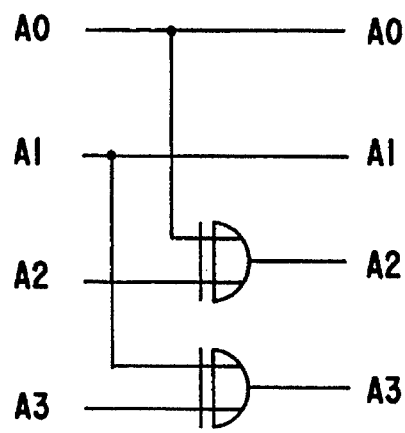

The relation between the selection of the data latches and the logical combination of the address inputs is illustrated in FIG. 8. It should be noted here that address inputs A4 and A5 used for dividing the memory cell arrays are not illustrated in FIG. 8 because attention is now paid to the selected block (for example, memory cell arrays MA0 to MA3, block data latch BDL0). FIGS. 9A and 9B show address scrambler circuits and truth tables for implementing them. These tables represent relationships between external addresses and internal addresses. They are implemented when the external address is sequentially incremented with A0 as its least significant bit and A3 as its most significant bit. This causes the data selector to select the data latches in the order of DL0, DL1, DL2, DL3, DL4 . . . DL15 in accordance with a vertical scan shown in FIG. 9A. They are also implemented when the external address is sequentially incremented so as to cause the data selector to select the data latches in the order of DL0, DL4, DL8, DL12, DL1, . . . DL15 in accordance with a horizontal scan shown in FIG. 9B.

The horizontal scan is explained more in detail by referring to FIG. 9B. A4 and A5 activate line 4 in FIG. 7 when they are (0, 0) and select the output of the data latches DL0 to DL15 by applying the outputs from memory cell arrays MA0, MA1, MA2 and MA3 shown in FIG. 6 to block data latch BDL0. When the data latch matrix shown in FIG. 8 is scanned in a horizontal direction, data selectors are selected in the order of DL0, DL4, DL8, DL12, DL1, . . . DL15. Then, in a case of one bit input and output configuration and in the case where internal addresses A3, A2, A1 and A0 are (0, 1, 1, 0) for example, output line 7 is activated in FIG. 7 when A3 and A2 are (0, 1), thereby selecting latches DL1, DL4, DL11 and DL14. Further, when A1 and A0 are (1, 0), a content of data latch DL11 is output to common data bus LD1 through output line 10. Namely, when external address 11 is designated by an external pin outside of a chip, the external address becomes a binary code (1, 0, 1, 1) corresponding to the number of 11 and then the internal address becomes (0, 1, 1, 0), thereby enabling a content of DL11 to be read out through the data selector circuit shown in FIG. 7. In other words, in case of one the bit output, the address value of the external address coincides with the data latch number. In case of four bit output, and where (A3, A2) are (0, 0), for example, data latches DL0, DL5, DL10 and DL15 are selected regardless of the internal addresses (A0, A1). The above explanation corresponds to the first cycle in FIG. 5D. The internal address is used to select a transistor in the data selector so that the data selector provides the output in accordance with a shifted diagonal method.

Accordingly, in the first reading cycle in FIG. 5D it is necessary to provide the internal addresses A3 and A2 as being (0, 0) in order to output four bit data from DL0, DL5, DL10 and DL15 by using the external address. In the truth table of FIG. 9B the external address designates one of the addresses (0 0 0 0), (0 1 0 0), (1 0 1 0) and (1 1 1 1). Therefore, the number of the external addresses in case of the four bit output, decreases to ¼ that of the external addresses in case of the one bit output.

In a case of the vertical scan, the relation between the input address and the data selector number is the same as that in the horizontal scan and the relation between the external address and the internal address is shown in FIG. 9A.

As described above, the method of reading 4-bit data four times by simultaneously driving four word lines and four column select lines in the 4-bit input/output configuration is made possible by use of the circuit of FIG. 7. Furthermore, it will also be appreciated that vertical and horizontal scans are made possible by simple scrambler circuits such as that shown in FIG. 9 for the 1-bit input/output configuration which is made by the S terminal using bonding option or AL master slice.

Third Embodiment

Figure 10B:
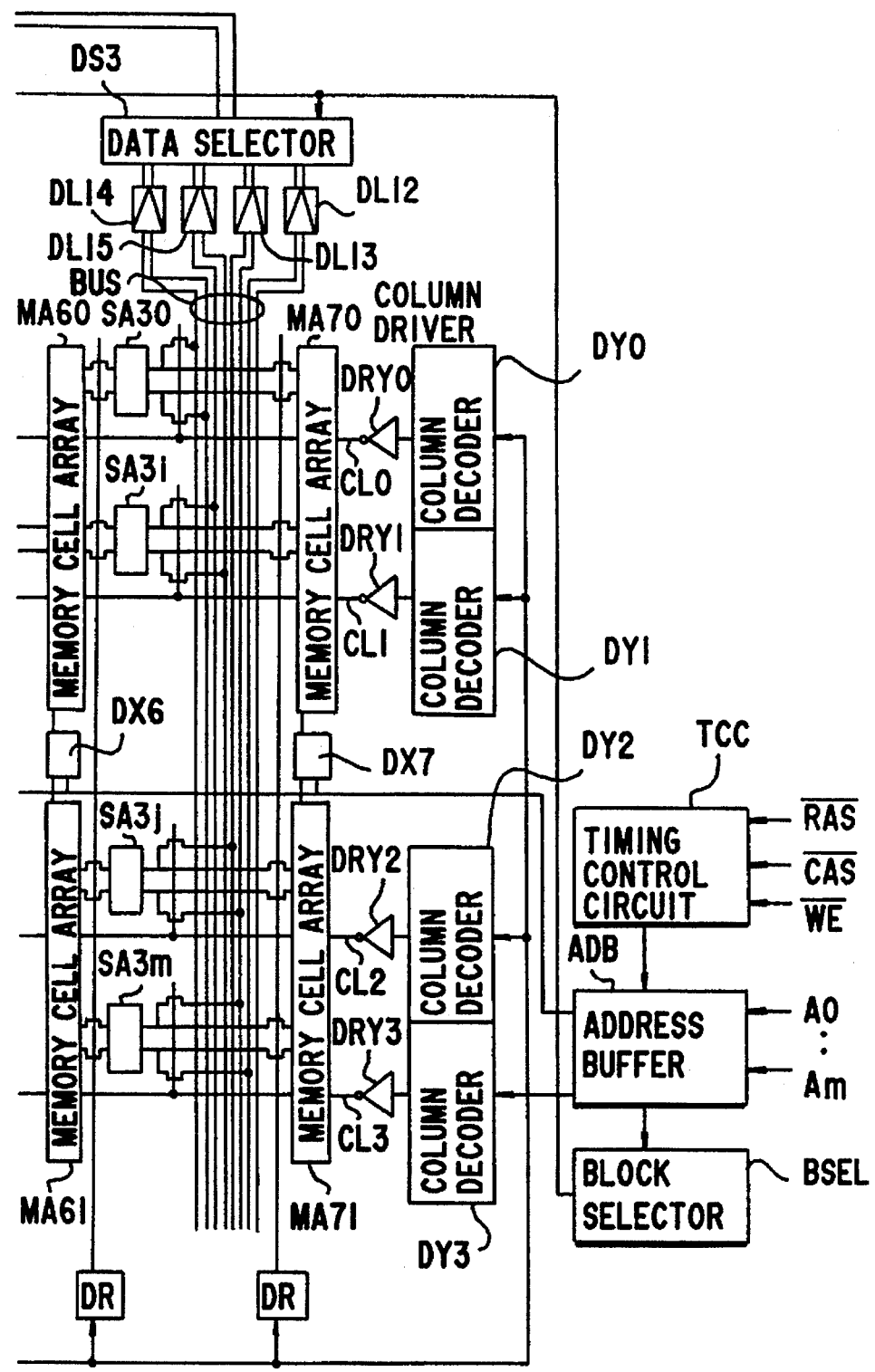

FIGS. 10a and 10b illustrate a third embodiment of the present invention.

In this embodiment, the present invention is applied to a DRAM in which each row decoder DX0, DX1, ... , DX7 is intervened between its respective memory cell pair MA00 and MA01, MA10 and MA11, MA20 and MA21, ... , MA70 and MA71, each pair being arranged in the row direction, and each row decoder being shared between the paired memory cell arrays. This is a modification of the first embodiment of FIG. 4. Like reference characters are used to designate parts corresponding to those in FIG. 4 and descriptions thereof are omitted.

In the semiconductor memory device, for example, corresponding word lines WL00 and WL01 in memory cell arrays MA00 and MA01 are selected by the same row address signal (A0) by using one row select driving circuit DX0. Of column select lines corresponding to bit lines BL00 to BL0i connected to memory cells CEL00 to CEL0i which are connected to word line WL00, for example, two column select lines CL0 and CL1, are driven simultaneously so that 2-bit data is output to data latches DL2 and DL3. Also, of column select lines corresponding to bit lines BL0j to BL0m connected to memory cells CEL0j to CEL0m which are connected--to word line WL01, for example, two column select lines CL2 and CL3 are driven simultaneously so that 2-bit data is output to data latches DL0 and DL1. Thus, a total of 4 bits of data is output from memory cells MA00 and MA01 to data latches DL0 to DL3.

It should be noted here that the selected word lines WL00 and WL01 have the same address, yet they are not the same address lines and they are mutually independent.

Likewise, 4-bit data connected to different column selct lines is output from each memory cell array block and thus 16-bit data is output to all the data latches. Subsequently, a total of 4 bits is output at a time from each 4-bit block in accordance with the shifted diagonal method shown in FIGS. 5A to 5D. In this case, even if a failure occurs in a column select line or word line in the memory cell array block corresponding to data latches DL0 to DL3, thus all the data connected to the column select line or word line fail, but only one bit fails of the 4-bit data which is finally output.

Thus, the Error Correcting Circuit is applicable.

Fourth Embodiment

Figure 11:
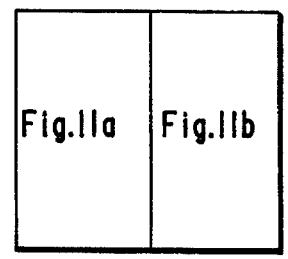
FIGS. 11a and 11b are a block diagram of a semiconductor memory device according to a fourth embodiment of the present invention.
Figure 11A:
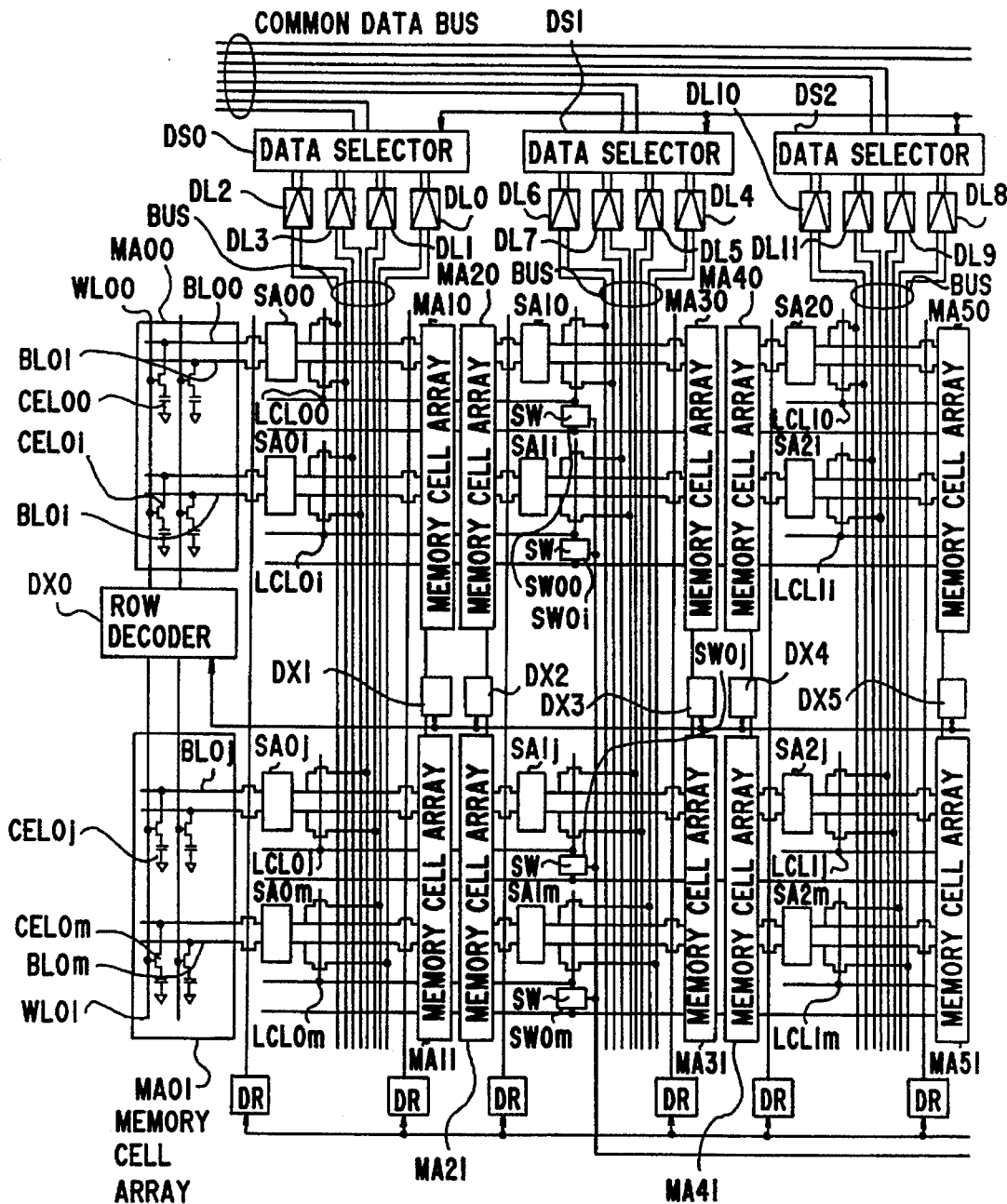
Figure 11B:
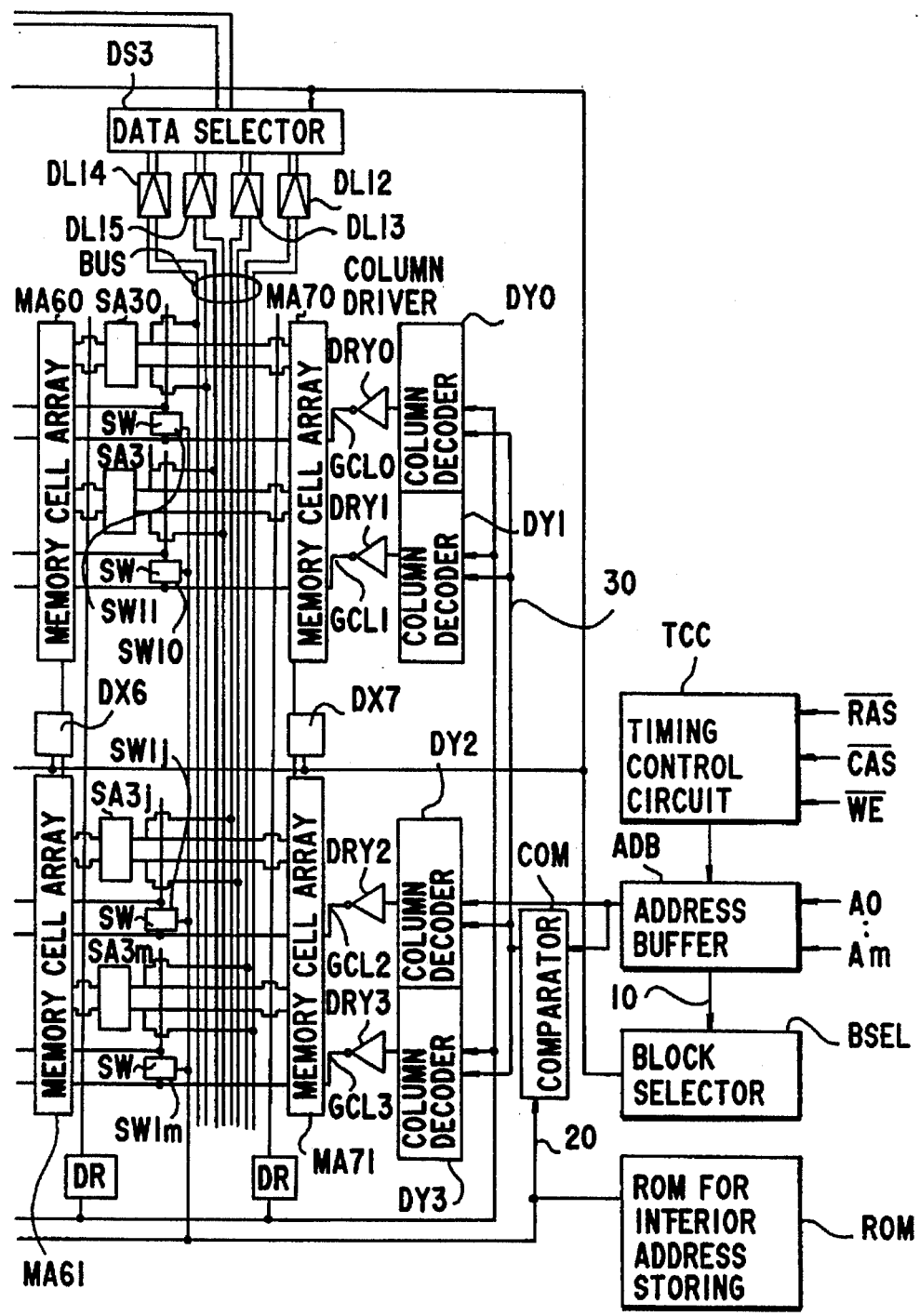

FIG. 11a and 11b illustrates a fourth embodiment of the present invention.

In this semiconductor memory device, the column select lines are divided into global column select lines (GCL0, GCL1, GCL2, ... GCLm) and local column select lines (LCL00, LCL0i, LCL0j, LCL0m, LCL10, LCL1i, LCL1j, LCL1m) and each of the local column select lines is connected to a corresponding global column select line via a switch (SW00, SW0i, SW0j, SW0m, SW10, SW1i, SW1j, SW1m). In the semiconductor memory device, the column selective drive circuit (DY0, DY1, DY2, DY3) is further provided with a spare column decoder (hereinafter referred to as a redundant column decoder, refer to FIG. 12) for a failing column select line or column decoder and each memory cell array (MA00 to MA0m, MA10 to MA1m) is provided with a spare memory cell array (hereinafter referred to as a redundant memory cell array, not shown) for failing memory cells. When externally applied address inputs (A0 to Am) are recognized to be defective address inputs, the redundant memory cells are selected by the redundant column decoder. The fourth embodiment is an example in which the present invention is applied to such a DRAM as described above and a modification of the third embodiment of FIG. 10. Like reference characters are used to designate parts corresponding to those in FIG. 10.

In this semiconductor memory device, corresponding word lines WL00 and WL01 in memory cell arrays MA00 and MA01 are selected by row selective drive circuit DX0 and data are read from memory cells CEL00 to CEL0m connected to word lines WL00 and WL01 onto their respective bit lines BL00 to BL0m. The operation described so far is the same as that in the third embodiment of FIG. 10. However, as an example, four global column select lines GCL0, GCL1, GCL2 and GCL3 may be selected simultaneously from among the column select lines and local column select lines LCL00, LCL0i, LCL0j and LCL0m selected through switches SW00, SW0i, SW0j and SW0m allow data to be latched by data latches DL0, DL1, DL2 and DL3 through BUS. It is this point that is distinct from the third embodiment of FIG. 10. The fourth embodiment is the same as the third embodiment in that 4 bits are finally output from 16-bit data read from four blocks one bit at a time from each block by the data selectors in accordance with the shifted diagonal method as shown in FIG. 5D. These 4 bits are output by different word lines and different local column select lines, thus permitting the use of the 1-bit Error Correcting Circuit.

The local column select line is made by using a third wiring layer in the multilayer interconnection and is shared among plural memory cell arrays (for example, MA00, MA10, MA20). Of course, the second wiring layer in the multilayer interconnection may be used instead without being shared among memory cell arrays.

Each of the column decoders (DY0 to DY3) of the semiconductor memory device has a redundant column decoder (refer to FIG. 12) and each of the memory cell arrays also has redundant memory cells corresponding to the redundant column decoders. The redundant memory cells are excluded from illustration because they are the same in arrangement and number as ordinary memory cells.

Figure 12:
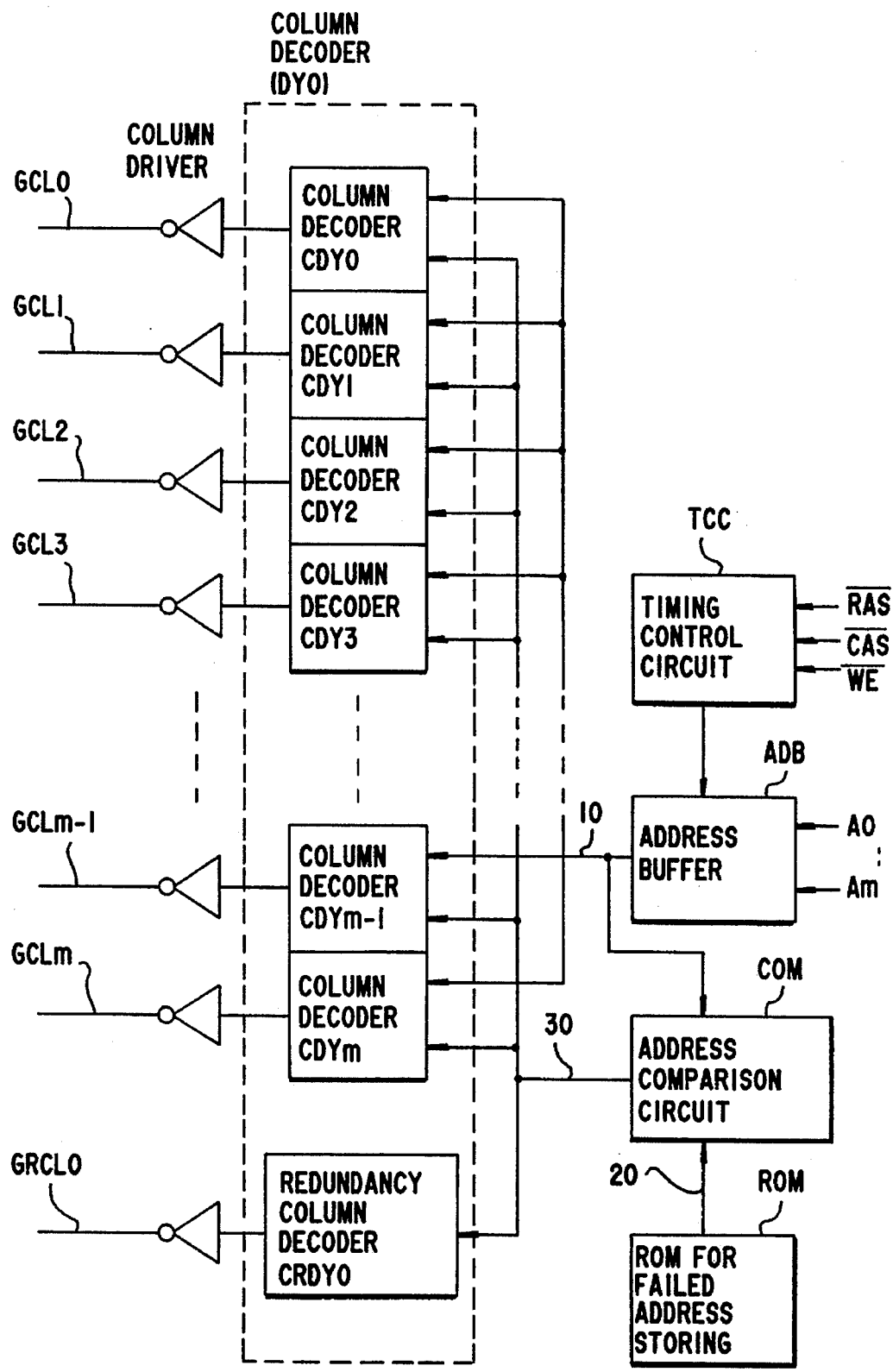
FIG. 12 is a block diagram of a prior column decoder.

FIG. 12 illustrates the detail of a column decoder (DY0 by way of example) and means for switching to defective address inputs. In addition to column decoders (CDY0 to CDYm) which operate when normal address inputs for reading normal memory cells a redundant column decoder (CRDY0) is placed. This redundant column decoder operates only when defective address inputs are entered.

A comparison is made between an address signal (10) obtained by amplifying an externally applied address signal (A0 to Am) by address buffer (ADB) and defective address signal (20) output from a defective address storing ROM (ROM) in which defective addresses are stored in advance by a comparator (COM). As a result, when no coincidence occurs, that is, when the externally applied address signal is recognized to be a normal address signal for reading a normal memory cell, one of the global column select lines (GCL0 to GCLm) is selected in accordance with an output (10) of address buffer ADB.

However, as a result of the above comparison, when a coincidence occurs, that is, when the externally applied address signal is recognized to be a defective address signal for reading a defective memory cell, each column decoder (CDY0 to CDYm) is disabled by an output (30) of the comparator (COM) and redundant column decoder (CRDY0) is thereby enabled to select redundant global column select line (GRCL0). That is, when a defective address signal is entered, the redundant decoder is enabled and the corresponding redundant memory cell (not shown) is selected. Therefore, the memory device is viewed from outside as if there were no defect. Although only one redundant decoder is illustrated in FIG. 12, it is obvious that plural decoders may be provided.

The switching of column select lines corresponding to defective memory cells to redundant column select lines in order to save the defective memory cells is also effective against row select lines and is thus generally executed. In addition, to improve the efficiency of the redundancy, it is normal to detect defective addresses for each memory cell array (for example, MA00), store them in a defective address storage ROM and determine defective addresses for each of the memory cell arrays.

If a redundancy occures in each of the memory cell arrays in the semiconductor memory device, as switches (SW00 to SW0m, SW10 to SW1m) interposed between the global column select lines and the local column select lines are closed, a problem arises in that the efficiency of the redundancy is lowered, as the column select line is commonly used by a plurality of number cells. For example, suppose that global column select line GCL0 is selected and local column select line LCL00 branched therefrom fails, or is short-circuited in memory cell array MA00. In this case, memory cell arrays MA40 and MA50, whose memory cells are normal, will also be regarded as defective. Thus, where memory cell arrays MA40 and MA50 are selected, switching to redundant column decoder CRDY0 is necessary.

With this semiconductor memory device, therefore, the switches interposed between the global column select lines and the local column select lines are switched by an output (20) of defective address storage ROM (ROM). Even if, for example, global column select line GCL0 is selected and local column select line LCL00 branched therefrom fails in memory cell array MA00, switch SW00 is opened by the output (20) of defective address storage ROM (ROM), thereby disconnecting the local column select line from the global column select line. When a defective address of memory cell array MA00 corresponding to global column select line GCL0 is selected, switching to the redundant column decoder is performed by such disconnection. However, when memory cell array MA40 is selected, global column select line GCL0 is available as before.

As described above, the column select line is doubled and thus even if two column select lines fail, one bit error output can be obtained according to the present invention, thereby permitting the use of the Error Correcting Circuit.

The above is a description of the case where the column select lines are doubled. If the row select lines are also doubled, the advantage will be further increased. In addition, fuses may be used in place of the switches (SW00 to SW0m, SW10 to SW1m). In this case, a fuse corresponding to a defective address may be blown to disconnect a local column select line from the corresponding global column select line.

According to the present invention, as described above, even if a failure occurs in a word line, a column select line (bit line) or a memory cell in a semiconductor memory device of a multi-bit input/output configuration, not all the bits fail and only one bit definitely results in an error. Therefore, the Error Correcting Circuit becomes available, thereby improving the system's reliability.

What is claimed is:

1. A semiconductor memory device including a plurality of memory cell arrays, each array having memory cells connected to a plurality of word lines and bit lines, said semiconductor memory device comprising:

row selection means for simultaneously activating a plurality of word lines;

a plurality of column selection driving means for simultaneously activating a plurality of column selection lines independently of each other, each of said activated column selection lines connected to a different one of said column selection driving means; and a plurality of data selector means for selecting from memory cells selected by simultaneously activated word lines and column selection lines, each of said memory cells selected by said data selector means being associated with a different word line and different column selection line than any other memory cell to be selected by said data selector means, each selected memory cell, associated with each of said plurality of data selector means, is selected with a same word line and a same column selection line as selected memory cells that are associated with other data selector means.

2. The semiconductor memory device according to claim 1, wherein said row selection means has a plurality of row decoders for receiving a common row address and each of said column selection driving means has a column decoder for receiving a common column address.

3. The semiconductor memory device apparatus according to claim 2, wherein a row decoder is provided between a pair of memory cells provided in a row direction, therein commonly using the row decoder.

4. The semiconductor memory device according to claim 1 wherein, each of said column selection lines is formed of a first wire layer and said word line is formed of a second wire layer.

5. The semiconductor memory device according to claim 1, further comprising an error correcting circuit for correcting a bit error included in data of one memory cell selected by said data selector means.

6. The semiconductor memory device according to claim 1 further comprising a latching means for latching a content of n memory cells selected by said column selection driving means, and wherein said data selector means is connected to an output of said latching means for selecting said content of m of said n memory cells, m being smaller than n.

7. The semiconductor memory device according to claim 6, wherein m read data are read out at times of n/m in a time divisional manner, therein enabling n data to be read out.

8. The semiconductor memory device according to claim 6, wherein said data selector means selects data by performing an on and off control of transistors, positioned in an adjacent row and an adjacent column to one another, in a diagonal configuration, said diagonal configuration shifts with each on and off control operation by using a signal obtained by decoding a part of an address signal.

9. The semiconductor memory device according to claim 8, wherein 4 bits of data are output from a 4 row by 4 column memory cell array which is part of a 16-bit memory.

10. The semiconductor memory device according to claim 6, wherein, an address signal for controlling a selection of said data selector means is obtained by converting an external address.

11. The semiconductor memory device according to claim 6, wherein said data selector means comprises a first data selector for selecting $m_1$ data from n bit data, $m_1$ being smaller than n, and a second data selector for selecting $m_2$ data from $m_1$ data, $m_2$ being smaller than $m_1$.

12. The semiconductor memory device according to claim 6, further comprising a block selecting means connected between said latching means and said data selector means, for selecting a single data latch block from a plurality of data latch blocks.

13. The semiconductor memory device according to claim 6 wherein said data selector means is connected to a plurality of common data bus lines for simultaneously outputting a plurality of bits and a single bit output data selector for selecting a single common data bus line is connected to said common data bus lines.

14. The semiconductor memory device according to claim 1, further including a redundant column selecting circuit with redundant memory cells.

15. The semiconductor memory device according to claim 14, wherein an external address is compared with a redundant address stored in a chip and, upon coincidence, a redundant column selective means for selecting a redundant memory cell is activated and a column selecting means for selecting an ordinary memory cell is made non-active.

16. The semiconductor memory device according to claim 15 wherein an external address is compared with a redundant address stored in a chip and, upon coincidence, a switch of a sub-selective line corresponding to the external address turns off.

17. The semiconductor memory device according to claim 1, wherein said semiconductor memory device forms a multi-bit input and output data line configuration and further comprising a column selecting means for simultaneously selecting one of said plurality of column selection lines independently of each other, a number of which is more than that of the input and output data line configuration, wherein a plurality of memory cells for simultaneously outputting or inputting data is provided at respective different word lines.

18. The semiconductor memory device according to claim 1, wherein said row selection means includes a row selecting circuit for selecting a redundant memory cell.

19. The semiconductor memory device according to claim 18, wherein an external address is compared with a redundant address stored in a chip and, upon coincidence, a redundant row selecting line for selecting a redundant memory cell is activated and a row selective circuit for selecting a normal memory cell is made non-active 20. The semiconductor memory device according to claim 18, wherein an external address is compared with a redundant address stored in a chip and, upon coincidence, a switch for a sub-selective line corresponding to the external address turns off.

21. A semiconductor memory device comprising:

a plurality of memory cell arrays each having memory cells connected to a plurality of word lines and bit lines;

a plurality of column selection driving means for activating a column selection line which is associated with memory cells on a selected word line in respective memory cell arrays and for simultaneously activating a plurality of column subselecting lines independently of each other, said column subselecting lines connected to said column selection line through switches therein simultaneously selecting a plurality of bit lines, each of said activated subselecting lines connected to a different one of said column selection driving means; and a plurality of data selector means for selecting from memory cells selected by simultaneously activated word lines and column subselecting lines, each of said memory cells selected by said data selector means being associated with a different word line and different column subselecting line than any other memory cell to be selected by said data selector means, each selected memory cell, associated with each of said plurality of data selector means, is selected with a same word line and a same column subselecting line as selected memory cells that are associated with other data selector means.

22. The semiconductor memory device according to claim 21, wherein said column selection line comprises a sub-column selecting line connected through a switch.

23. The semiconductor memory device according to claim 22, wherein an external address is compared with a redundant address and, upon coincidence, a switch for the sub column selection line corresponding to the external address turns off.

24. A semiconductor memory apparatus comprising:

a plurality of memory cell arrays having a memory cell connected at an intersection point of a plurality of word lines and bit lines which are wired in a matrix;

a plurality of column selection driving means for activating a column selecting line which is associated with memory cells on a selected word line in respective memory cell arrays and for simultaneously activating a plurality of subselecting lines independently of each other, said subselecting lines connected to said column selecting line through fuses, therein simultaneously selecting a plurality of bit lines, each of said activated subselecting lines connected to a different one of said column selecting driving means; and a plurality of data selector means for selecting from memory cells selected by simultaneously activated word lines and column subselecting lines, each of said memory cells selected by said data selector means being associated with a different word line and different column subselecting line than any other memory cell to be selected by said data selector means, each selected memory cell, associated with each of said plurality of data selector means, is associated with a same word line and a same column subselecting line as selected memory cells that are associated with other data selector means.

25. The semiconductor memory apparatus according to claim 24, wherein the sub selecting line selecting a failed cell is disconnected by blowing said fuses.

26. A semiconductor memory device comprising:

a plurality of memory cell arrays each having memory cells connected to a plurality of word lines and bit lines which are wired in a matrix;

a plurality of means for simultaneously activating a plurality of column selection lines independently of each other and for simultaneously selecting a plurality of said bit lines selected from among bit lines connected to memory cells by the same word line in said respective memory cell arrays, each of said column selection lines connected to a different one of said plurality of means; and a plurality of data selector means for selecting from memory cells selected by simultaneously activated word lines and column selection lines, each of said memory cells selected by said data selector means being associated with a different word line and different column selection line than any other memory cell to be selected by said data selector means, each selected memory cell, associated with each of said plurality of data selector means, is associated with a same word line and a same column selection line as selected memory cells associated with other data selector means.

27. The semiconductor memory device according to claim 26, wherein an independently activated column selection line is connected to a transferring means for transferring the data of the bit line connected to a plurality of memory cells to a bus through a source-drain path.

28. A semiconductor memory device having a plurality of memory cells connected to a plurality of word lines and bit lines in an array comprising:

a plurality of column selecting means for simultaneously activating a plurality of column selecting lines independently of each other when information stored in a memory cell connected to one of said word lines is transmitted to one of the bit lines by activating said one of said word lines;

latching means for latching the information stored in n memory cells by said plurality of column selecting means; and a plurality of data selecting means for selecting the information stored in m of the n memory cells connected to an output of said latching means, each of said m memory cells selected associated with a different word line and different column selecting line than any other m memory cell to be selected by said data selecting means, each selected n memory cells, associated with each of said plurality of data selecting means, is associated with a same word line and a same column selecting line as selected memory cells associated with other data selecting means.

* * * * *